United States Patent [19]

Thorkildsen et al.

[11] Patent Number: 4,653,160
[45] Date of Patent: Mar. 31, 1987

[54] APPARATUS FOR MAKING FINISHED WIRE HARNESSES OR SUB-ASSEMBLIES THEREFOR

[75] Inventors: Finn Thorkildsen; Thierry Pepin, both of Hovik; Tom Lunde, Hosle, all of Norway

[73] Assignee: ARTOS Engineering Company, New Berlin, Wis.

[21] Appl. No.: 549,662

[22] Filed: Nov. 8, 1983

[30] Foreign Application Priority Data

Nov. 10, 1982 [NO] Norway ................................. 21693

[51] Int. Cl.$^4$ .......................... H01R 43/04; H02G 1/12
[52] U.S. Cl. .................................. 29/33 M; 29/564.6; 29/564.8; 29/749; 29/857; 140/105
[58] Field of Search ............... 29/33 M, 564.4, 564.6, 29/749, 564.8, 566.1, 566.2, 857, 872, 753, 26 A; 140/105; 72/7

[56] References Cited

U.S. PATENT DOCUMENTS

| | | | |
|---|---|---|---|
| 3,766,624 | 10/1973 | Grebe et al. | 29/564.8 |
| 4,077,118 | 3/1978 | McKeever | 29/749 X |
| 4,100,780 | 7/1978 | Sassak | 72/7 |
| 4,166,315 | 9/1979 | Gudmestad et al. | 29/564.4 |
| 4,238,981 | 12/1980 | Karl | 29/564.6 |
| 4,486,928 | 12/1984 | Tucker et al. | 29/26 A |

Primary Examiner—Z. R. Bilinsky
Attorney, Agent, or Firm—James E. Nilles; Thomas F. Kirby

[57] ABSTRACT

Programmable apparatus makes finished wire harnesses or sub-assemblies therefor from segments of insulated wire which may differ in length, gauge or insulation color. The apparatus includes a selector module which draws wire strands from a plurality of wire coils and presents them in a desired sequence to a wire loader module which then feeds a desired length of each strand to a conveyor end and then severs it. The conveyor comprises two laterally spaced conveyor units, having a releasable wire guide therebetween, which releasably grip each wire segment near its opposite ends. Stripper modules and terminal presses alongside the two conveyor units enable selective stripping and terminal attachment at either or both segment ends. A wire double associated with a conveyor unit is selectively operable to group the ends of two or more segments in that conveyor unit so that a single terminal can be attached thereto. A block loader module associated with a conveyor unit is operable to insert stripped ends or terminated ends (single or multiple) of wire segments into apertured insulated terminal blocks.

14 Claims, 33 Drawing Figures

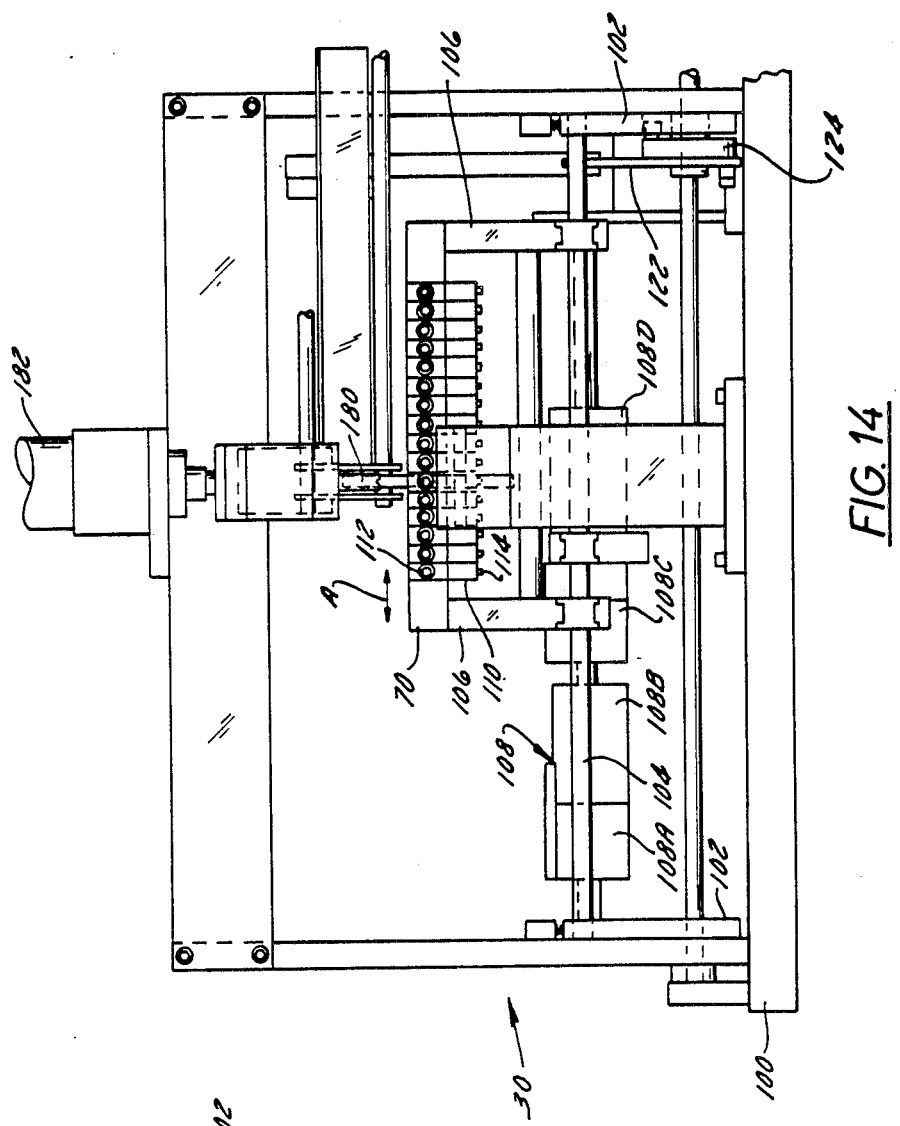
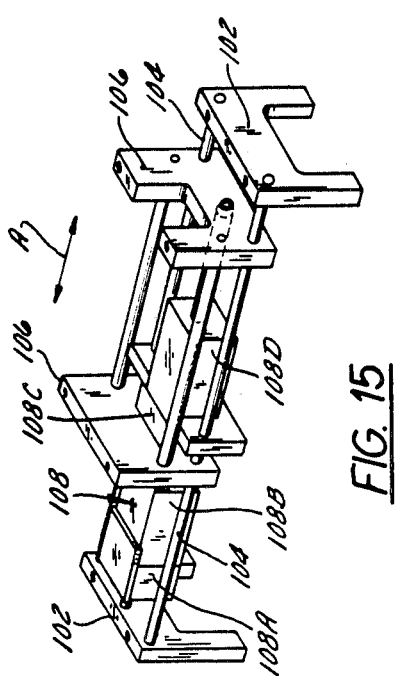
FIG. 14
FIG. 15

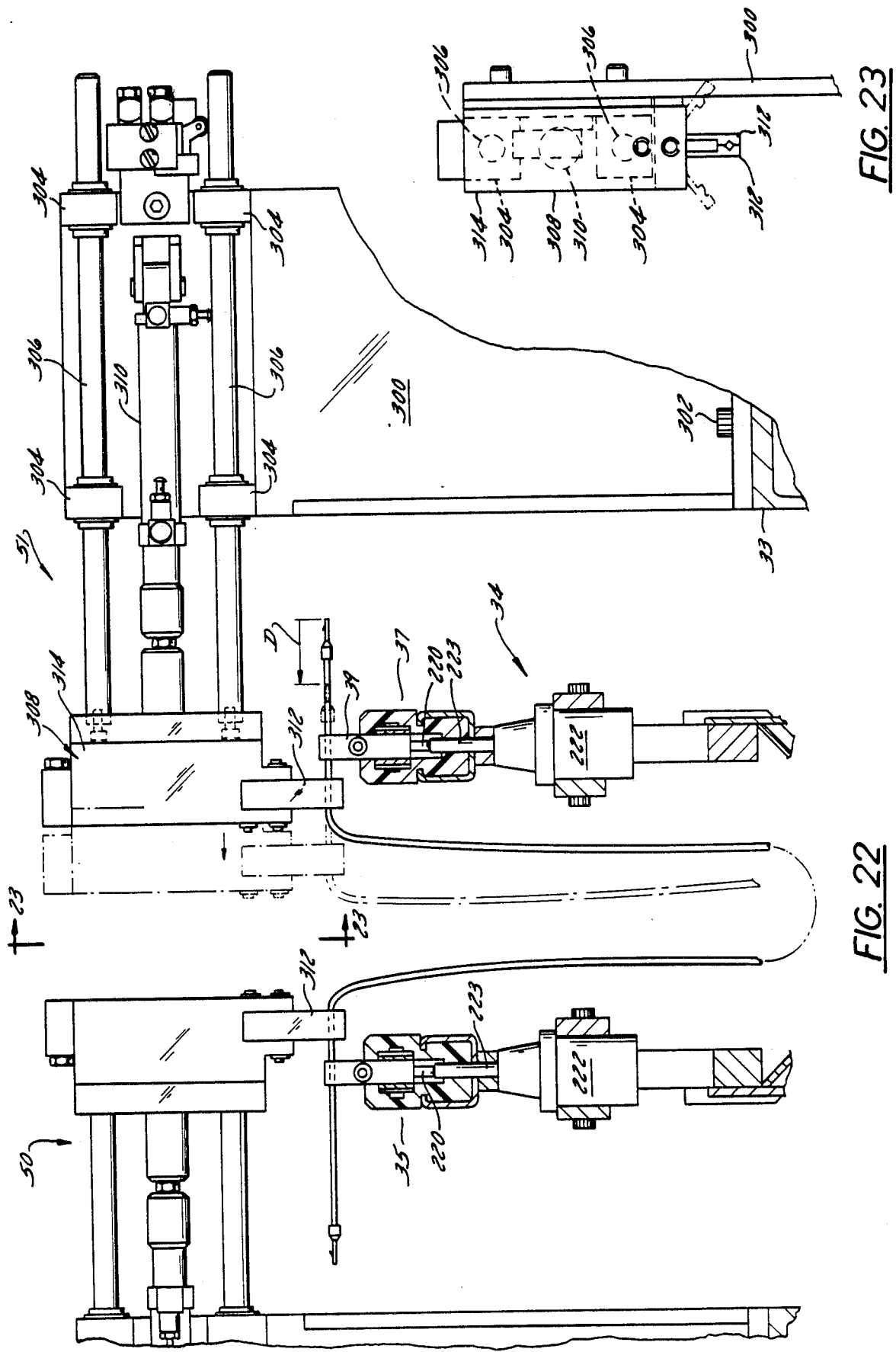

APPARATUS FOR MAKING FINISHED WIRE HARNESSES OR SUB-ASSEMBLIES THEREFOR

BACKGROUND OF THE INVENTION

1. Field of Use

This invention relates generally to programmable apparatus for making finished wire harnesses or sub-assemblies therefor.

In particular, it relates to such apparatus which is operable to provide a predetermined sequence of wire segments which differ in various respects (i.e., length, gauge, color), to attach terminals to either or both ends of selected segments, to attach a single terminal to the ends of two or more selected segments, and to insert the ends of selected segments into an insulated apertured terminal block.

2. Description of the Prior Art

Wire harnesses used in electrical systems of automobiles and other vehicles, domestic appliances, electronic equipment or the like, are custom-designed to suit particular needs and assume a wide variety of forms. Some merely comprise an assemblage of wire segments, each of desired length, gauge or color, with the segment ends being bare or provided with suitable terminals. Others go further and require two or more selected wire segments to be attached to a single terminal (called "doubling") or require some or all of the segment ends (unterminated or terminated and single or doubled) to be inserted into apertures in a plastic insulated terminal block or housing.

Heretofore, batches of the various sub-assemblies were manufactured and then sorted and assembled into finished harnesses. Sub-assembly manufacture was usually carried out on apparatus able to process only one size of wire or cable during a given production run, although in some instances different types of terminals could be attached. Special assembly techniques, such as doubling or terminal block attachment, were carried out as separate steps either manually or on special machines which needed to be fed manually because of the complexity of the harness. In one type of prior art system doubling was accomplished by feeding stripped wire segments from two separate wire cutting and stripping machines which were arranged end-to-end into a common terminal attachment machine which crimped a single terminal to the stripped ends of a pair of wire segments being received from the two wire cutting and stripping machines. Needless to say, such prior art production techniques are very time-consuming and costly because they involve numerous sequential repetitive low volume slow production steps, frequent re-setting or re-adjustment of available production machines to accommodate production runs of different sizes of wire and terminals or availability of extra machines, and much manual labor. However, although some programmable prior art wire processing machinery is available which is especially well-suited for high-speed, high-volume production of pre-fabricated sub-assemblies, it is usually able to handle only one type of wire at a time in each production run, although different segment lengths and types of termination can be accomplished.

SUMMARY OF THE PRESENT INVENTION

The present invention provides improved programmable high-speed apparatus for fabricating finished wire harnesses (or sub-assemblies therefor) such as are used in automobiles and other vehicles, domestic appliances, electronic equipment or the like. The apparatus operates to provide individual insulated wire segments which differ from one another in various respects. For example, the wire segments may differ as to length or gauge or insulation color or marking, or may differ as to the amount of insulation stripped from either end. The apparatus is further operable to convey such segments in some desired predetermined order, to strip insulation from segment ends as required, to attach terminals of the same or different types to either or both stripped ends of the segments, to connect the stripped ends of two or more selected wire segments to a common terminal (called "doubling") and to connect either or both ends of one or more segments, terminated or unterminated, single or doubled, to plastic terminal housings or blocks in some predetermined order.

The apparatus comprises a wire selector module, a wire loader module, a wire transfer conveyor, and disposed alongside the wire transfer conveyor at various work stations are: insulation stripper modules, wire doubler modules, terminal attachment presses, wire markers, and terminal block attachment modules. Programmable control means and drive means are provided to operate all of the components in the apparatus in appropriate selected sequences and synchronism.

The wire selector module draws wire strands from a plurality of different coils and presents them one at a time in a desired sequence to the wire loader module. The wire loader module feeds each strand along a first path into the wire transfer conveyor and then severs a wire segment of desired length therefrom for conveyance by the conveyor in incremental steps along a second path (which is transverse to the first path) for further processing at the various work stations therealong. The wire transfer conveyor comprises a pair of laterally spaced apart chain type conveyor units, each of which comprises a plurality of releasable wire gripping clamps spaced apart along the length of the endless flexible rotatable conveyor chain, and an openable/closable elongated wire guide located along the first path between the conveyor units. The wire guide comprises a switch therein which effects opening and closure of a door at the bottom of the wire guide. In operation, the wire loader module feeds each strand into a set of open wire-gripping conveyor clamps and through the closed elongated wire guide therebetween. The advancing wire triggers the switch which causes the bottom of the wire guide to open and allow a downwardly depending wire loop of desired length to form between the conveyor units, whereupon the wire feed stops, the pair of conveyor clamps close, the wire segment is severed, and the severed segment is conveyed to the several work stations where stripping, terminal attachment, marking, doubling and block attachment occur, as needed. Each wire doubler module is located ahead of a terminal attachment press and is operable, if required, to release and remove an end of a selected wire segment from the clamp in which it was originally gripped and to insert it into an on-coming clamp which already contains an end of another wire segment to thereby enable an appropriate terminal attachment press to attach a single electrical terminal to the ends of both wire segments, thereby providing one type of wire harness. Each terminal block attachment module is located near the discharge end of the conveyor and is operable, if required, to present an insulating apertured terminal block and to insert the ends of selected segments (single or doubled) and, with or without an electrical terminal attached in the case of single segment, into selected apertures in the terminal block to thereby provide another type of wire harness. The block apertures may be arranged in rows in a single layer or in a plurality of such layers, one above the other.

Apparatus in accordance with the present invention offers several advantages over the prior art. For example, it is efficient and able to be easily and quickly programmed for a wide variety of short-term, high-speed production runs which are currently of increasing economic importance and high priority in supplying the changing needs of customers, as well as for long-term production runs.

The apparatus is highly automated and reduces to a minimum the number and complexity of manual operations needed to manufacture simple or complex wiring harnesses. The apparatus lends itself to use with a wide variety and complex arrangement of many (up to 25, for example) pieces of associated equipment such such as insulation strippers, fluxing and tinning units, doubling modules, terminal attachment presses, block attachment units, and other related pieces of equipment. The apparatus enables production and processing of wire segments which range in length from several inches to several feet without requiring corresponding changes in overall size of the apparatus. Harnesses can be provided which employ variable numbers of wire segments which vary in color, length, gauge or any combination thereof and which employ terminals of various types and sizes. Programs can be manually entered on a keyboard or by a pre-programmed tape oassette or equivalent data storage means.

Other objects and advantages of the invention will hereinafter appear.

DRAWINGS

FIG. 14 is a side elevation view of the wire loader module taken on line 14—14 of FIG. 13;

FIG. 15 is a perspective view of a guide assembly shown in FIGS. 13 and 14;

FIG. 22 is an enlarged view, partly in cross-section, of a typical wire pull-back unit employed at various locations in the apparatus;

FIG. 23 is a view taken on line 23—23 of FIG. 22;

DESCRIPTION OF PREFERRED EMBODIMENTS

General Arrangement

Figure 1:
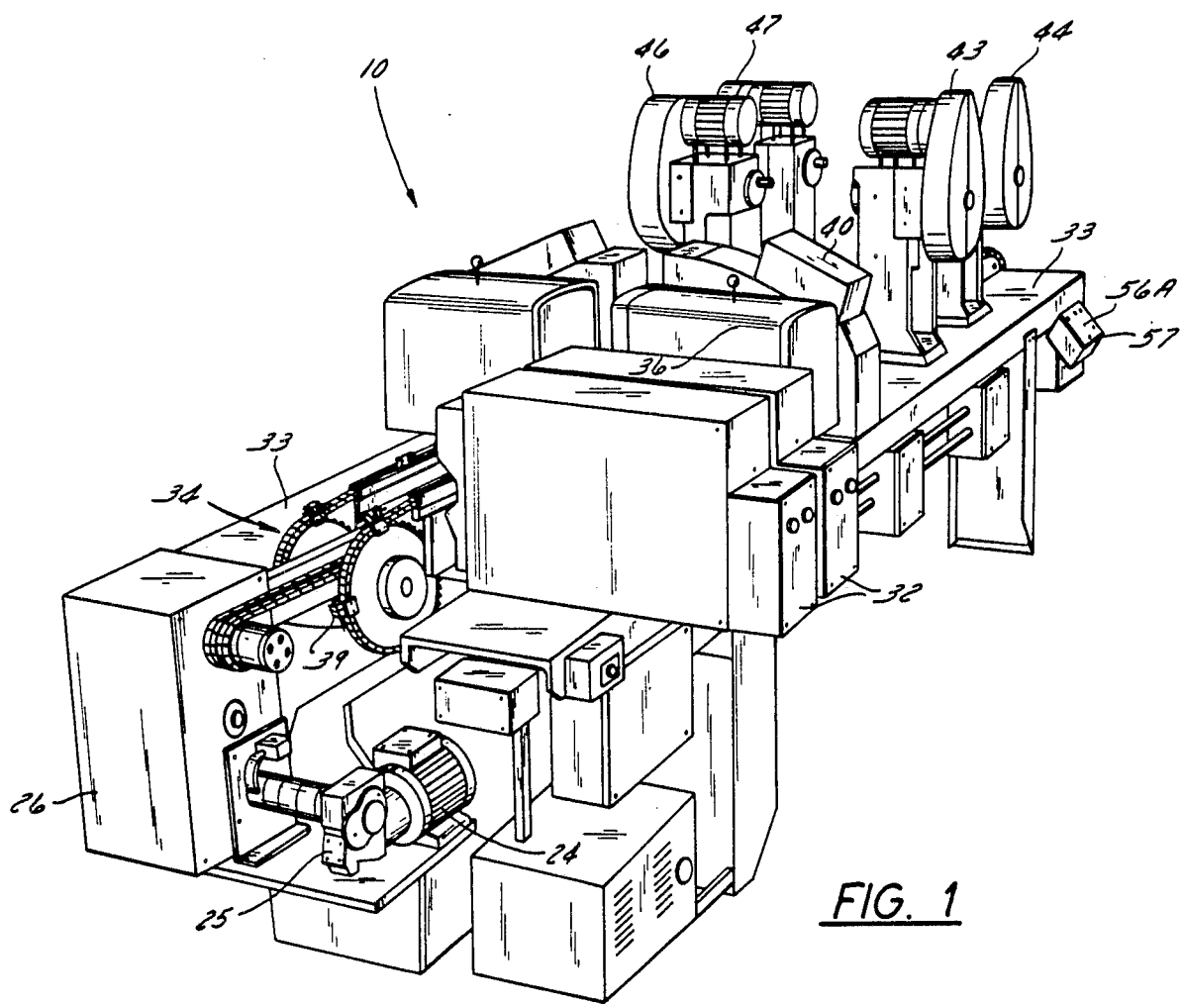
FIG. 1 is a perspective view of apparatus in accordance with the invention taken from the infeed end thereof.
Figure 2:
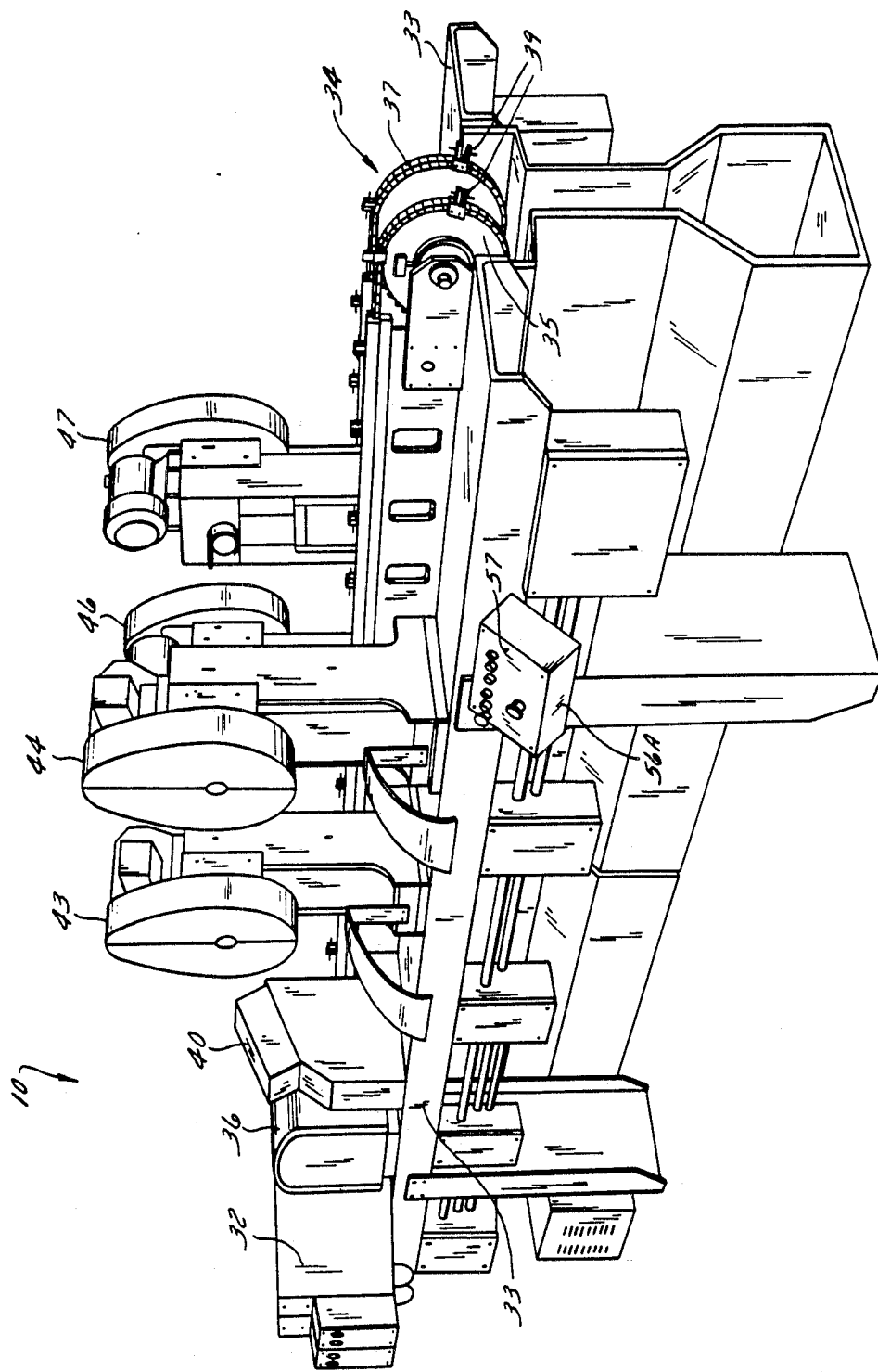
FIG. 2 is a perspective view of the apparatus taken from the output end.
Figure 3:
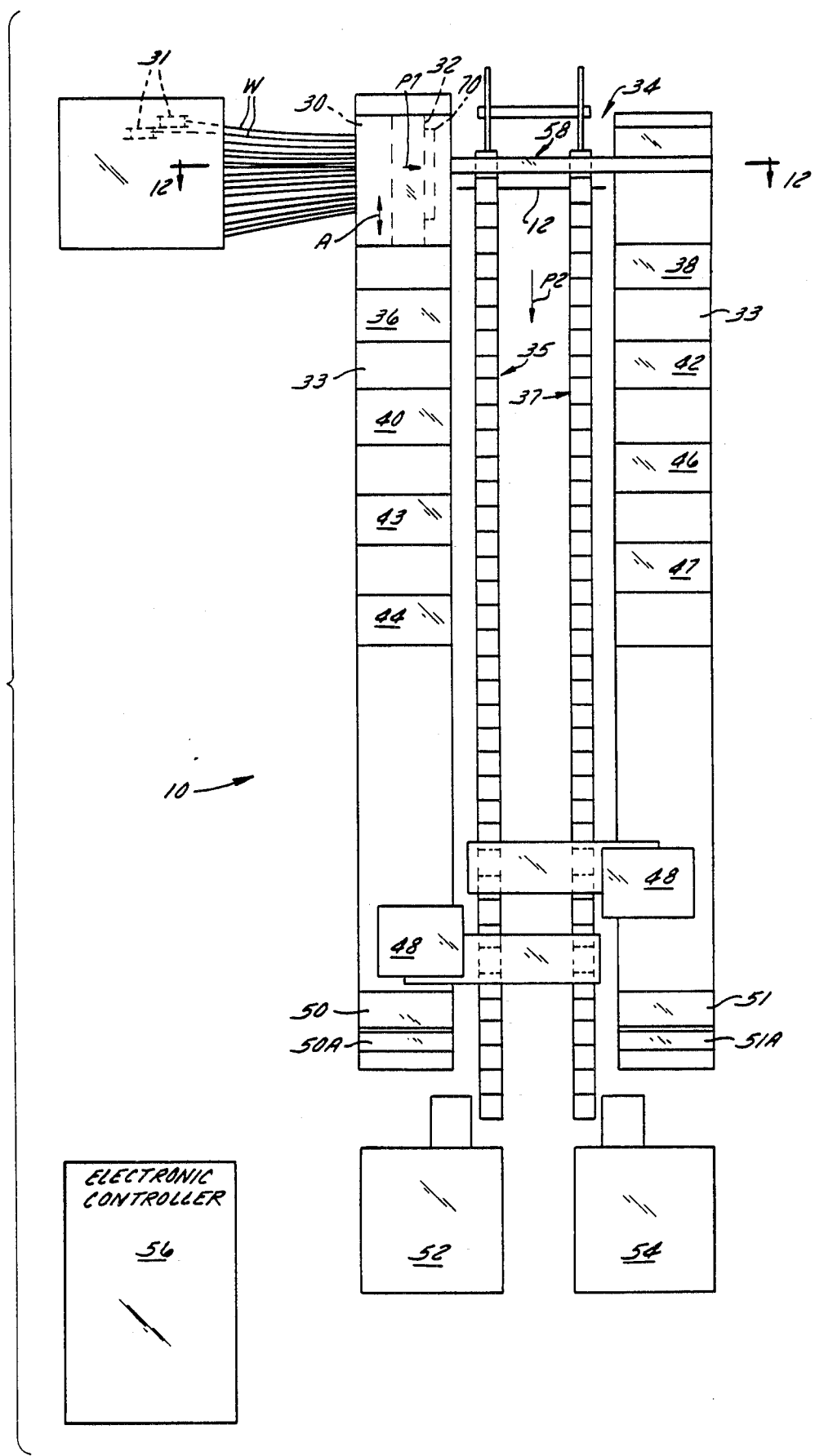
FIG. 3 is a top plan schematic view of the apparatus.

In FIGS. 1, 2 and 3 the numeral 10 designated apparatus in accordance with the invention for making finished wire harnesses or sub-assemblies therefor. FIGS. 1 and 2 are perspective views of opposite sides of the apparatus 10, both taken from the infeed and discharge ends thereof, respectively, and FIG. 3 is a top plan schematic view of the apparatus.

Figure 4:
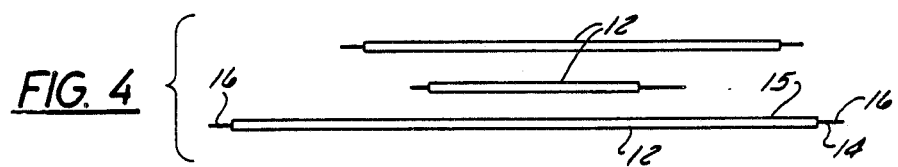
FIGS. 4 through 11 are plan views of various types of wire harnesses and sub-assemblies therefor which are made by the apparatus of FIGS. 1 through 3.
Figure 5:
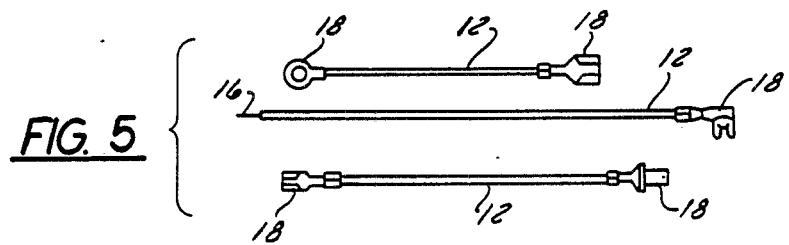
Figure 6:
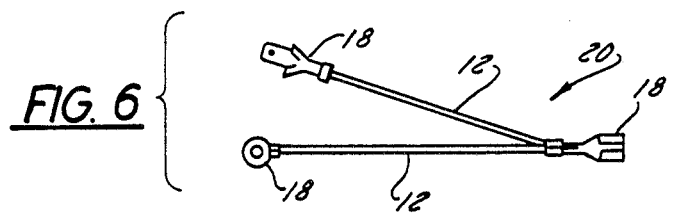
Figure 7:
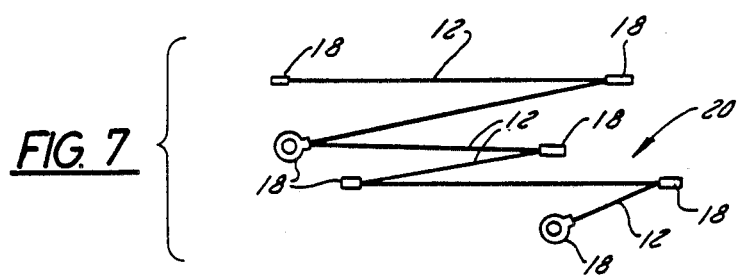
Figure 8:
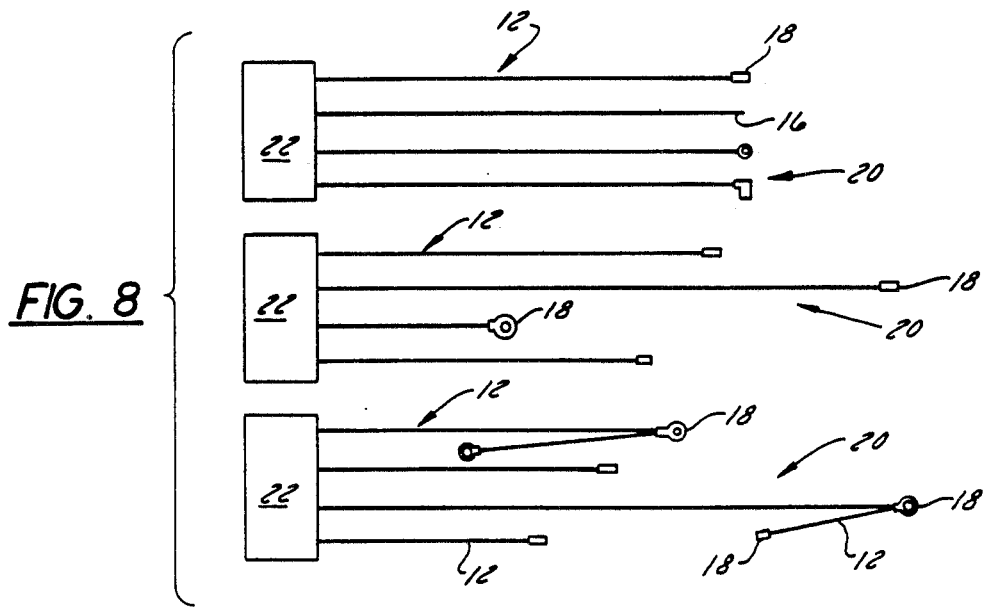
Figure 9:
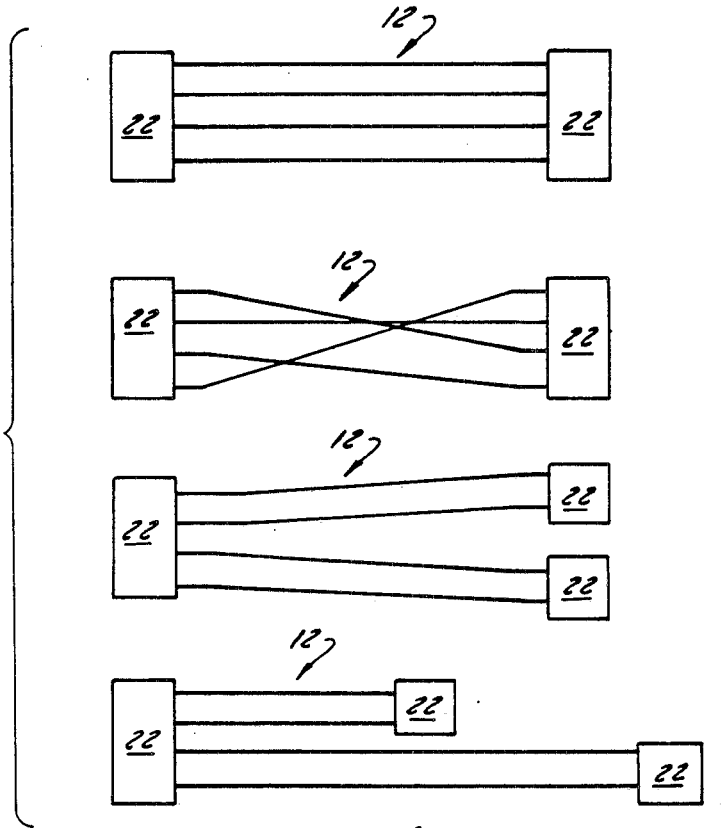
Figure 10:
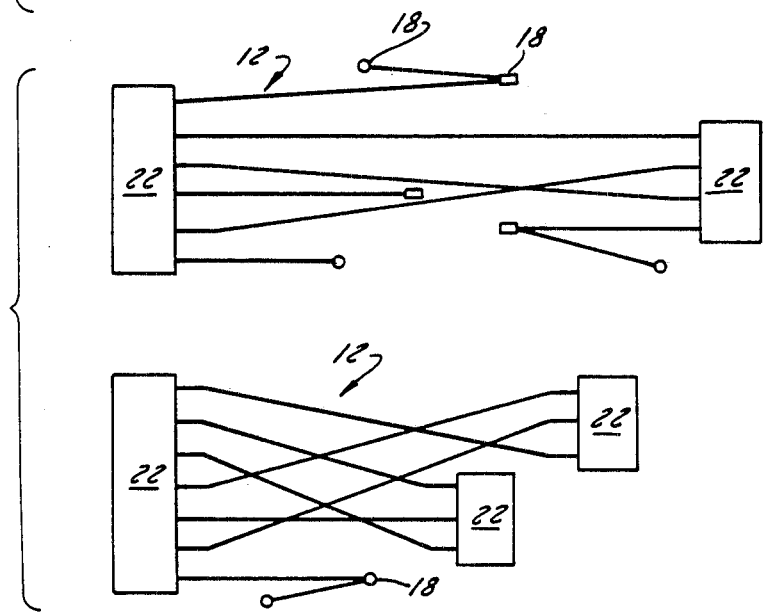
Figure 11:
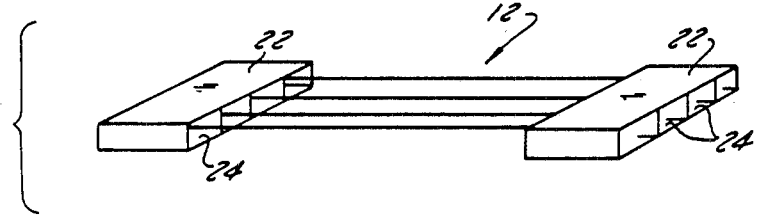

FIGS. 4 through 11 show various types of finished wire harnesses and sub-assemblies therefor which can be produced by the apparatus 10. In FIGS. 4 through 11 each wire segment, regardless of its length, is designated by the numeral 12. As FIG. 4 shows, each discrete segment 12 comprises an electrical conductor wire 14 (preferably stranded) which is surrounded by a layer of insulation 15 and, as a result of stripping, has a portion of the insulation removed so as to expose ends 16 of the conductor 14. As FIG. 5 show, either or both ends 16 of a segment 12 may be provided with an electrical terminal attached thereto by crimping and each such terminal, regardless of size or type, is designated by the numeral 18. FIG. 6 shows a simple wire harness 20 comprising two segments 12, each having one end connected to a common terminal 18 to illustrate the simplest form of "wire doubling". FIG. 7 shows a more complex wiring harness 20 comprising six segments 12 with the ends of pairs of segments connected to common terminals 18 to illustrate multiple doubling. FIGS. 8, 9, 10 and 11 show various types of wiring harness, each of which comprises one or more insulated plastic apertured terminal blocks or housings designated by the number 22, regardless of shape, size or type, and each block comprises a plurality of apertures or cavities 24, each adapted to receive the unterminated or terminated end of a segment 12. In FIG. 8, three different harnesses 20 are shown and each comprises one block 22 which is associated with one end of four segments 12 (of the same or dissimilar lengths) and suitable termination, such as a terminal 18, at the other end of each single or doubled segment. In FIGS. 9, 10 and 11, each harness 20 comprises at least two blocks 22. In FIG. 9, each end of each segment 12 is connected to a block 22. In FIG. 10, each end of some segments 12 are connected to blocks 22, whereas other segments 12 have one end connected to a block 22 and have the other end (single or doubled) connected to a terminal 18. FIG. 11 shows a type of block 22 which accommodates a single layer of segments 12, one alongside another. Other harness and segment arrangements besides those shown in FIGS. 4 through 11 are capable of being produced by the apparatus 10.

Referring to FIGS. 1, 2 and 3, the apparatus 10 operates to provide individual insulated wire segments 12 which differ from one another in various respects. For example, the segments 12 may differ as to length or gauge or insulation color or marking. The apparatus 10 is further operable to convey the segments 12 in some desired predetermined order, to strip insulation from the segment ends 16 as required, to attach terminals 18 of the same or different types to either or both stripped ends 16 of the segments 12, to connect the stripped ends 16 of two or more selected segments 12 to a common terminal 18 (called "doubling") and to connect either or both ends 16 of one or more segments 12, terminated or unterminated, single or doubled, to the plastic terminal housings or blocks 22 in some predetermined order.

The apparatus 10 generally comprises a wire selector module 30, a wire loader module 32, a wire transfer conveyor 34, and disposed alongside the wire transfer conveyor at various work stations on the conveyor tables 33 are: insulation stripper modules 36 and 38, wire doubler modules 40 and 42, terminal attachment presses 43, 44, 46 and 47, a pair of wire marker modules 48, pull-back modules 50 and 51, continuity test modules 50A and 51A, and terminal block attachment modules or block loaders 52 and 54. Programmable control means 56 including a control cabinet 56A and drive means (hereinafter described) are provided to operate all of the components in the apparatus in appropriate selected sequences and synchronism.

As FIG. 3 shows, the wire selector module 30 draws wire strands from a plurality of different coils or spools 31 and presents them one at a time in a desired sequence to the wire loader module 32. The wire loader module 32 feeds each strand W along a first path P1 into the wire transfer conveyor 34 and then severs a wire segment 12 of desired length therefrom for conveyance by the conveyor 34 in incremental steps along a second path P2 (which is transverse to the first path P1) for further processing at the various work stations therealong. The strands of wire W may take the form of PVC insulated stranded wire on the order of 0.5 mm² to 1.5 mm² in area, from the plurality of spools 31. In the embodiment shown, sixteen wire strands W are provided but a greater or lesser number could be provided. The strands W may resemble or differ from one another as hereinbefore explained and any number of strands from 1 to 16, for example, may be employed to provide a desired batch of wire segments 12 or a wire harness 20 of desired configuration. The strands W extend through a shiftable multiple wire loader 70 of wire loader 32 and the latter is reciprocably movable in the direction of an arrow A (FIG. 3) by means, such as a pneumatic actuator 108, which responds to the programmable controller, hereinafter described, to present a desired strand W at a given time to a linear feed roll unit, hereinafter described, which operates in response to a motor to drive a predetermined length of strand W along path P1. The wire selector module 30 operates in accordance with a program to choose one of up to 16 different wire strands, for example, of various colors and dimensions. The loader module 32 operates to measure it, feed it into the conveyor 34 and cut it before the conveyor is indexing. The conveyor 34 then transports the segment 12 stepwise to the different modules located along the conveyor tables 33. The type of module at each work station may vary according to the configuration of the apparatus. The maximum linear speed of the wire feed is 5,0 m/s with an accuracy on the measured length of $+/-1.5$ mm. However, the practical linear feed speed rate will depend on the prefeeding performance.

With the foregoing general arrangement and mode of operation in mind, the following specific modules and components are hereinafter described in detail: the wire selector module 30; the wire loader module 32; the wire guide module 58 located at the infeed end of the conveyor; the wire conveyor 34, the wire stripper modules 36 and 38; the wire doubler modules 40 and 42; the terminal attachment presses 43, 44, 46 and 47; the wire marker modules 48; the wire pull-back modules 50 and 51; the continuity test modules 50A and 51A; the block leader modules 52 and 54; and the electronic controller 56.

Referring to FIG. 1, it is to be understood that conveyor 34 is driven by a conveyor drive motor 24 through a worm gear assembly 25 and a geneva gear system 26 which ensures accurate indexed movement of the conveyor in incremental steps. Furthermore, as will hereinafter appear, certain movable components in the various modules are driven by pneumatic motors or cylinders, including an arrangement of pneumatic cylinders stacked end-to-end as hereinafter described. And, as hereinafter explained, the wire strand drive rollers in the wire leader module 32 are driven by a servo-motor which ensures rapid but accurate feed of wire strands. In any case, all such motors are under the control of electronic controller 56.

Wire Selector and Wire Loader Modules

Figure 12:
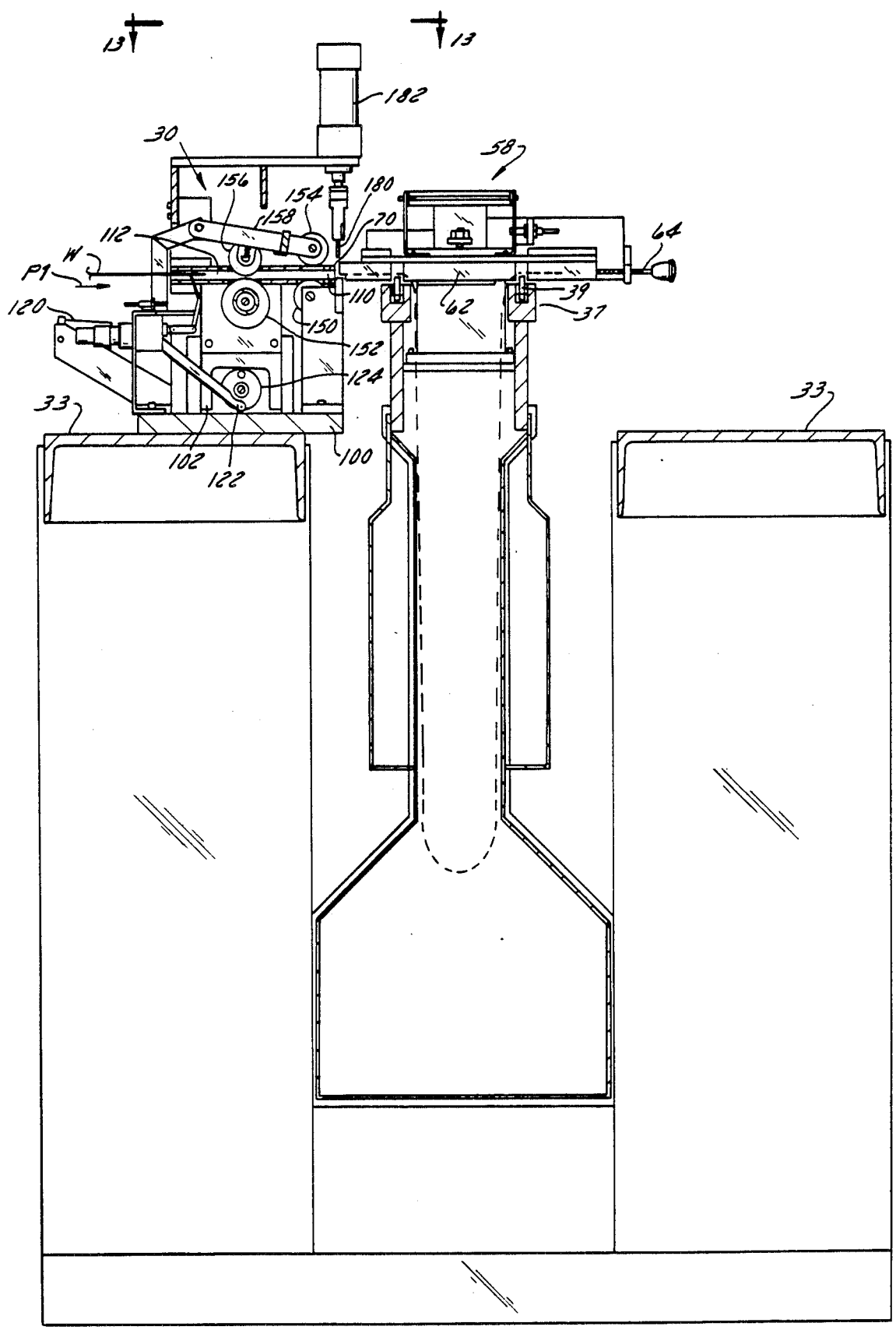
FIG. 12 is an enlarged cross-section view taken on line 12—12 of FIG. 3.
Figure 13:
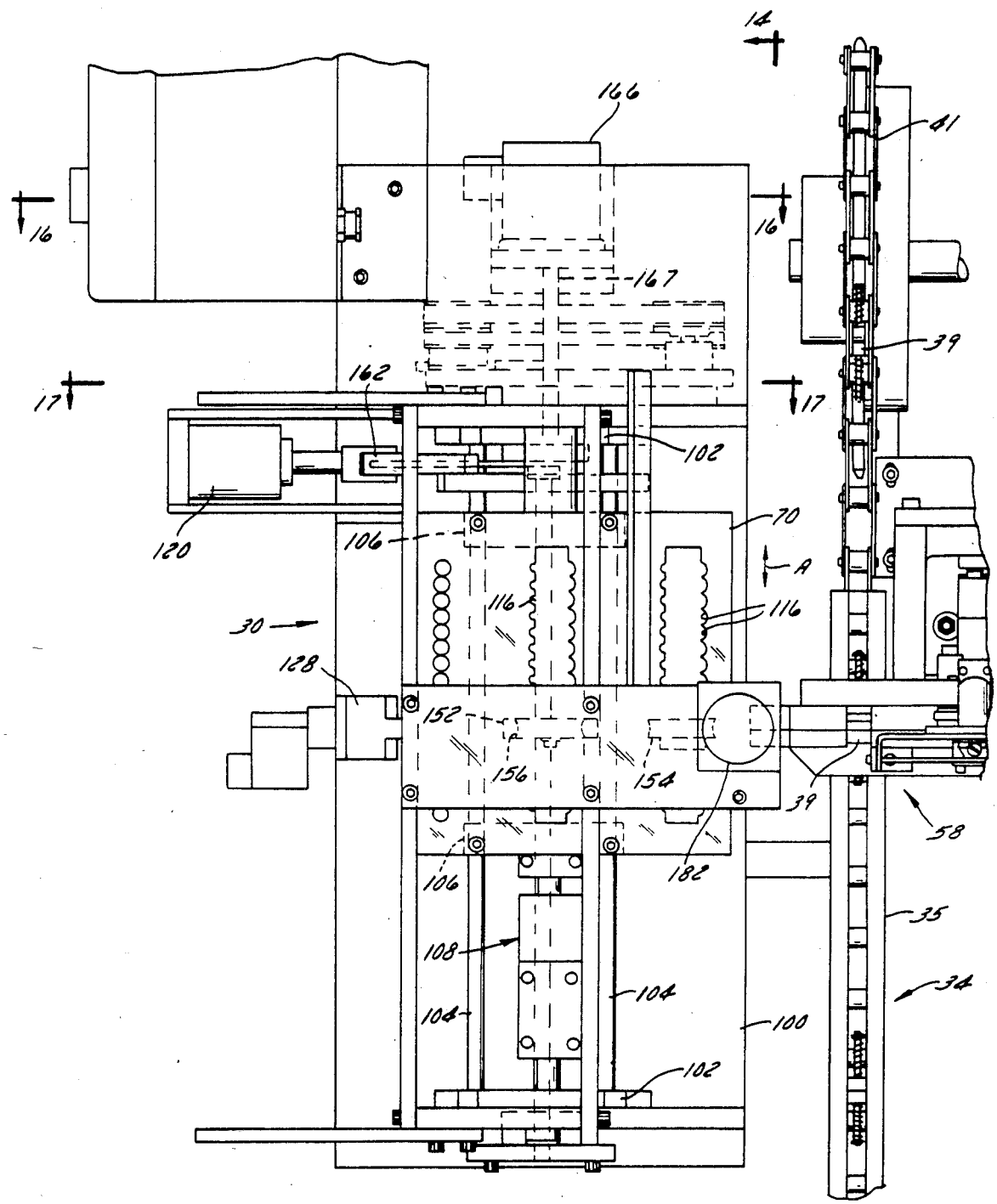
FIG. 13 is an enlarged top plan view of a wire selector module, a wire loader module and portions of a wire transfer conveyor taken on line 13—13 of FIG. 12.

As FIGS. 13, 14 and 15 best show, wire selector module 30 comprises a stationary supporting framework or base 100 disposed adjacent one side of conveyor 34. A pair of vertically movable spaced-apart support plates 102 between which a pair of guide rails 104 are supported are mounted on base 100. A wire loader head 70 is slidably mounted horizontally on the rails 104 by means of a pair of end plates 106 and is reciprocably movable in the direction of arrow A to any one of 16 positions by means of a drive mechanism 108. The support plates 102, as well as the loader head 70 mounted thereon, are also movable vertically (about ¾ inch) between a lowered position shown in FIGS. 12, 14 and 18 and a raised position (not shown) by means of a pneumatic cylinder 120 through a linkage 122 and a cam 124 which rotates to raise and lower the support plates 102. Loader head 70 comprises 16 wire feed units 110 which are arranged side-by-side with one another, and each unit 110 includes a wire-receiving tube or passage 112 and a wire lock 114 therein through which a wire stand W from a coil 31 extends. Each tube 112 is provided with a pair of roller-receiving slots 116 on its upperside and with a pair of roller-receiving slots 118 on its underside. Wire lock 114 is biased to locked position (FIG. 18) by a compression spring 126 but is movable to release position by actuation of a pneumatic cylinder 128 and its associated linkage 130.

The drive mechanism 108 for shifting loader head 70 horizontally in incremental steps so that a selected one of the 16 wire feed units 110 becomes aligned with a passage in the wire guide module 58 comprises a plurality of pneumatic cylinders 108A, 108B, 108C, 108D, axially arranged end-to-end. Each cylinder 108A-D is connected to the next through the cylinder top or the cylinder rod. Each cylinder has different stroke lengths, to suit the desired step movement. Preferably, the step drive device is arranged such that the first cylinder has a stroke length equal to the distance between the wire in the wire register. The other cylinders have stroke lengths, which is rising multiple of the stroke length of the first cylinder. If one wishes, for example, sixteen definite steps, one can manage with four cylinders, where the one clyinder has a stroke equal to the distance between the wires W, while the other three cylinders have stroke lengths, which make up the rising multiple of the first-mentioned stroke length. The second cylinder will then have a stroke length, which is two times the stroke length of the first cylinder. The third cylinder will have stroke length, which is four times the stroke length of the first cylinder; and the fourth cylinder will have a stroke length, which is eight times the stroke length of the first cylinder. Totally, one will then have sixteen defined-equal steps. The air cylinders, air intake and exhaust are controlled by individual air valves, so that one, at any time, can achieve the desired position of the wire register in relationship to the pair of wire feeding wheels.

In operation, under the direction of electronic controller 56, wire leader head 70 is raised vertically so as to be clear of the rollers in the wire leader module 32 and is then shifted horizontally so that a desired wire feed unit 110 (which a wire strand W already lock in place therein) is located adjacent the passage in the wire guide module 58, whereupon the leader head 70 is lowered vertically.

Figure 16:
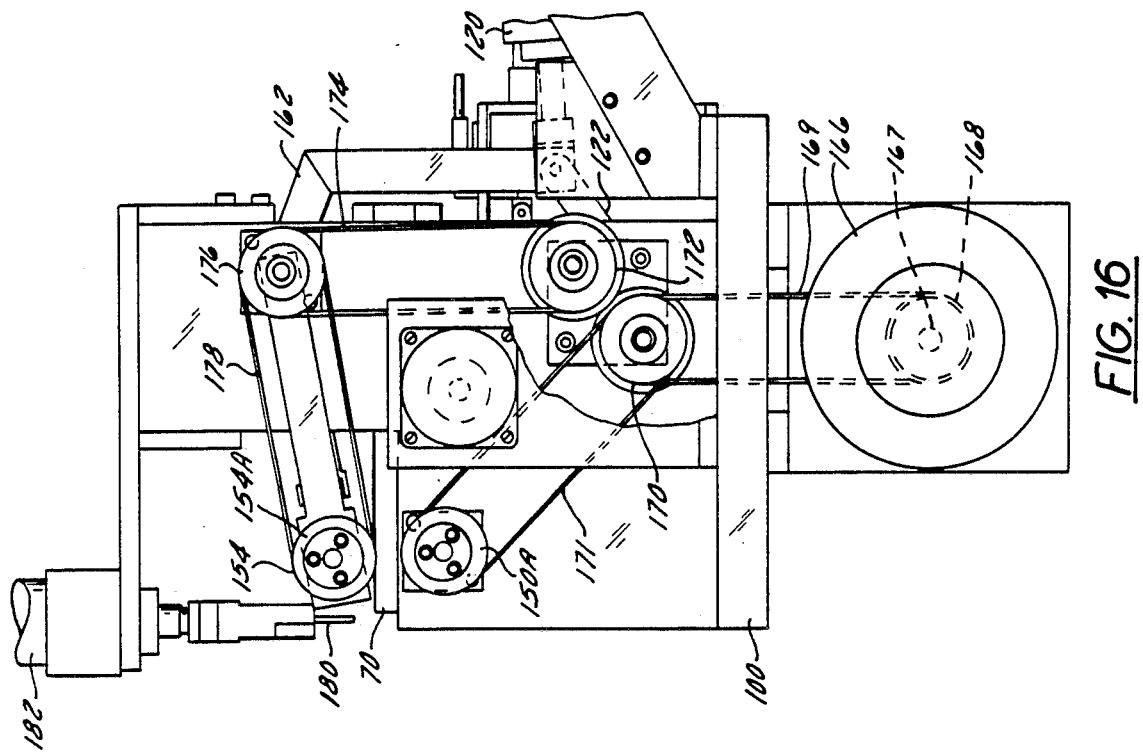
FIG. 16 is an elevation view of a drive mechanism taken on line 16—16 of FIG. 13.
Figure 17:
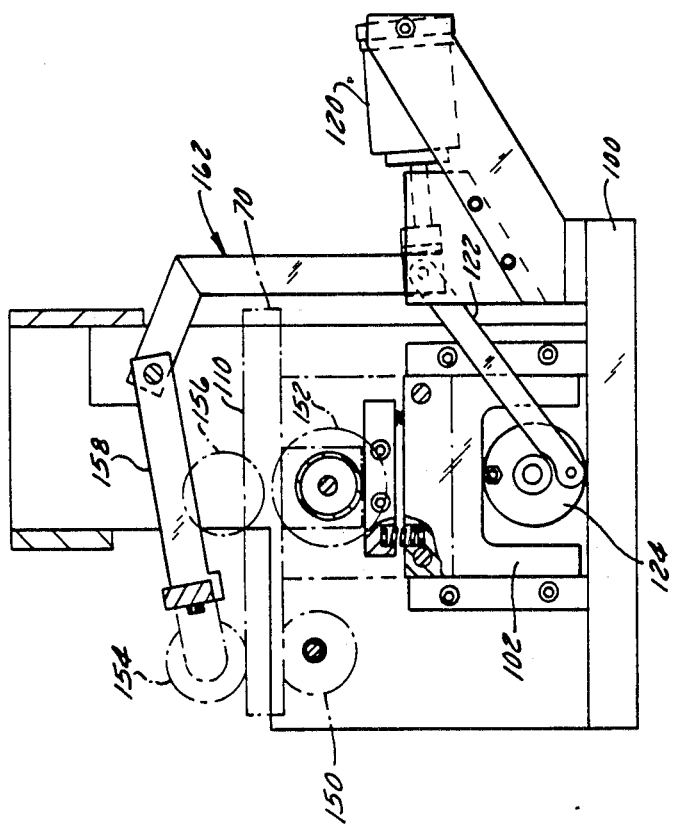
FIG. 17 is an elevation view of a feed roll mechanism taken on line 17—17 of FIG. 13.
Figure 18:
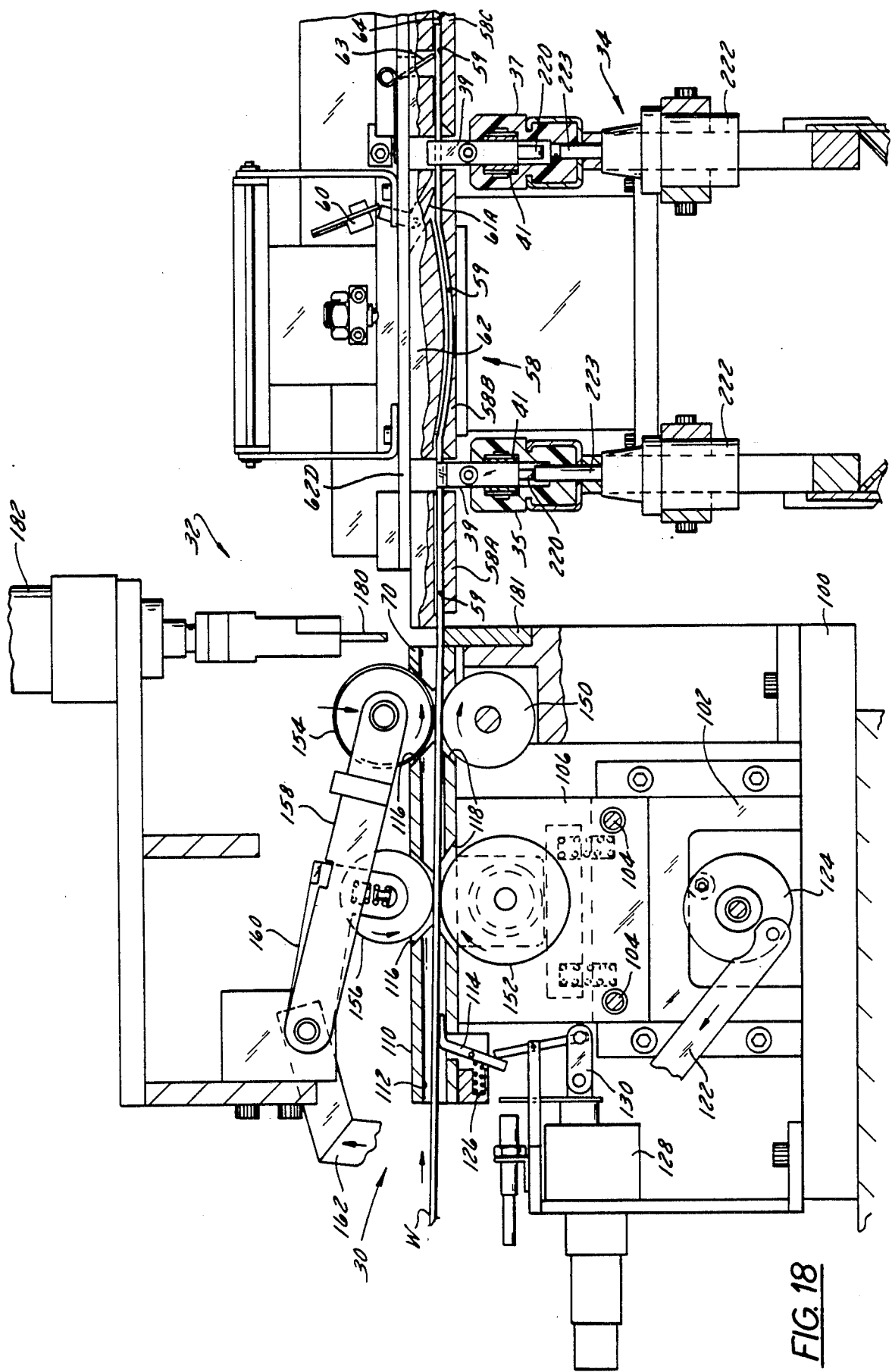
FIG. 18 is a greatly enlarged and more detailed view of the components shown at the upper portion of FIG. 12.

As FIGS. 12, 13, 14, 16, 17 and 18 best show, the wire loader module 32 comprises a lower feed roller 150 and a lower measuring roller 152 which extend into the lower slots 118 in tube 112 to engage the wire strand W therein when head 70 is in lowered position. The upper slots 116 in tube 112 receive an upper feed roller 154 and an upper measuring roller 156 which are rotatably mounted on vertically pivotable lever arms 158 and 160, respectively. The lower rollers 150 and 152 are not vertically movable but the upper rollers 154 and 156 can be raised or lowered into operative position by means of pneumatic cylinder 120 and a linkage 162 which is connected thereto and to the arms 160 and 158. As FIG. 18 shows, lowering of arm 158 causes the latter to engage and raise arm 160. As FIG. 16 show, both of the feed rollers 150 and 154 are driven by a servo-motor 166. Shaft 167 of motor 166 carries a pulley 168 which drives an endless belt 169 which, in turn, drives a pulley 170. Pulley 170 drives an endless belt 171 which, in turn, drives a pulley 150A which is connected to drive lower feed roller 150. Pulley 170 also drives a pulley 172 and an endless belt 174 thereon which, in turn, drives a pulley 176. Pulley 176 drives an endless belt 178 which, in turn, drives a pulley 154A which is connected to drive upper feed roller 154. Both feed rollers 150 and 154 propel the wire strand W engaged therebetween to whatever length is established by electronic controller 56, which length is measured by measuring rollers 152 as the strand moves thereacross and effects rotation thereof. Since motor 166 is a servo-motor it can be started and stopped very precisely to thereby ensure accurate strand lengths.

As FIGS. 12, 13, 14, 16 and 18 show, a wire severing blade 180 is located between the feed rollers 150 and 154 and the conveyor 34 and this blade is operated by a pneumatic cylinder 182 to sever wire segments 12 of desired lengths from the wire strands W in response to commands from the electronic controller 56. Blade 180 cooperates with an anvil 181 on base 100.

Wire Conveyor and Wire Guide Module

As FIGS. 1, 2, 3, 12, 13 and 18 show, the wire transfer conveyor 34 comprises a pair of laterally spaced apart chain type conveyor units 35 and 37, each of which comprises a plurality of releasable wire gripping clamps 39 spaced apart along the length of an endless flexible rotatable conveyor chain 41 in each unit, and an openable/closable elongated wire guide 58 located along the first path P1 between and on each side of the conveyor units 35 and 37. Conveyor 34 is driven as hereinbefore explained.

Figure 19:
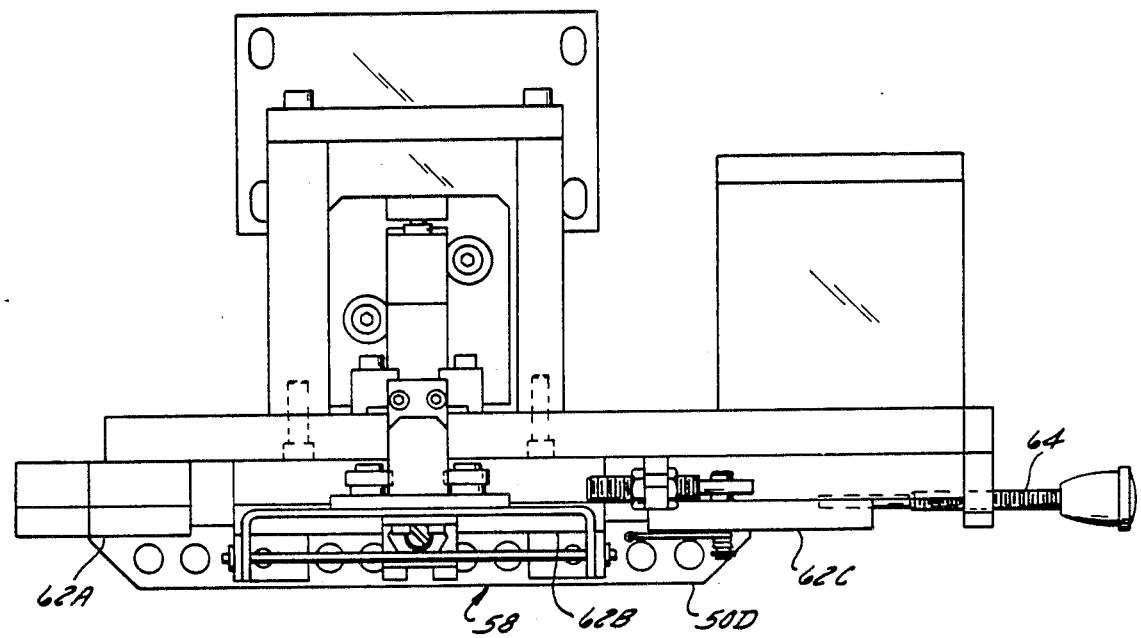
FIG. 19 is a top plan view of the wire guide means shown at the right side of FIG. 18.
Figure 20:
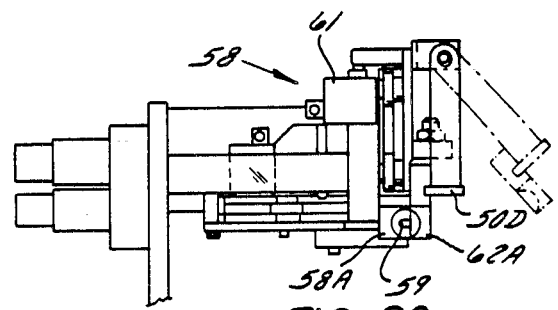
FIG. 20 is a side elevation view, on a reduced scale, of the wire guide means of FIG. 19.
Figure 21:
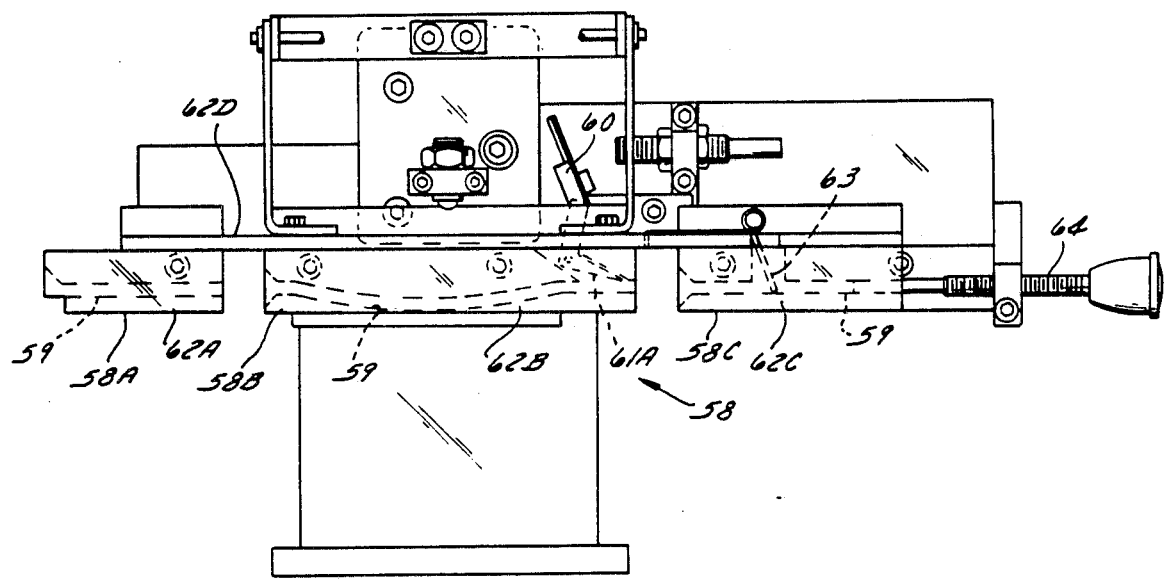
FIG. 21 is a front elevation view of the wire guide means of FIGS. 19 and 20.

As FIGS. 12, 18, 19, 20 and 21 best show, the wire guide 58 comprises a passage 59 having an electric switch 60 associated therewith which operates opening and closure of a door 62 at the side of the passage 59 of the wire guide 58. More specifically, wire guide 58 includes an intermediate guide portion 58B located between the conveyor units 35 and 37, an infeed guide portion 58A located between conveyor unit 35 and unit 32 and an outfeed guide portion 58C located on the outside of conveyor unit 37. Each portion 58A and 58C has a funnel-shaped opening affording easy wire access into passage 59 which extends through all three portions 58A, 58B and 58C. The electric switch 60, or at least an actuator 61A therefor, is located in passage 59 in portion 58B. A spring-type wire lock 63 to prevent reversal or withdrawal of the wire strand W is located in passage 59 in portion 58C. As FIGS. 19 and 21 show, an adjustably positionable stop member 64 closes the end of passage 59 in portion 58C. Each guide portion 58A, 58B, 58C has a pivotable door portion designated 62A, 62B, 62C, respectively, which operate together to move to open and closed positions, being connected by a bracket 62D to actuator 61.

In operation, as FIG. 18 shows, the wire loader module 32 feeds each strand W into a set of open wire-gripping conveyor clamps 39 and through the closed elongated wire guide passage 59 therebetween. The advancing wire strand W triggers the switch 60 which signals electronic controller 56 which, in turn, actuates a pneumatic ram 61 and causes the door 62 at the side of the wire guide 58 to open and allow a downwardly depending wire loop of desired length to form between the conveyor units 35 and 37. Whereupon the controller 56 further operates so that the wire feed stops, the pair of conveyor clamps 39 close, the wire segment 12 is severed, and the severed segment is conveyed to the several work stations where stripping, terminal attachment, marking, doubling and block attachment occur, as needed. Door 62 reclosed and the system resets itself to receive the next selected strand W.

The conveyor 34 is a "free standing" type with side tables 33 for location of the various modules, which in type and quality are selected and adjusted to the output requirement of the apparatus 10. The distance between the conveyor chains 41 of the units 35 and 37 is fixed and the strand W will, depending on length, hang between the conveyor legs during the transport, as FIG. 12 shows. The conveyor 34 can be constructed in various lengths to accommodate, for example, from 10 to 25 stations (see FIG. 3). Each module occupies from 2 to 3 stations. The length of the conveyor table (number of stations) varies according to the number of modules needed. In practice, the number of working stations will be less than the number of conveyor stations due to the sizes of different modules. The distance between the two chains 41 is 150 mm, for example, and the distance between two consecutive clamps 39 on the chain 41 (station distance) is 190.5 mm. A conveyor drive is provided to index the chains 41. The drive comprises the Geneva mechanism 26 activated by servo-motor 24' (or through a clutch if desired). The indexing time is 0.3 seconds.

Wire Stripper Modules

As FIGS. 1, 2 and 3 make clear, each stripper module 36 and 38 is programmable and may, for example, take the form of a commercially available machine such as a modified CS-18, a machine using standard toolholder and V-blades, available from ARTOS Engineering Company. Such machine is equipped with means to adjust wire size in 4 programmable steps from 0.5 mm$^2$ to 1.5 mm$^2$, PVC insulated, stranded wire and with means to adjust stripping length in 4 programmable steps from 3 mm to 15 mm.

Wire Doubler

As FIGS. 1, 2, 3 and 24 through 28 show, each wire doubler module or means 42 is located upstream of a terminal attachment press 43, 46 and operates to pick up one end 16 of a selected wire segment 12 from its clamp 39 and to insert it into an on-coming clamp 39 which already carries the end 16 of another wire segment 12A (see FIG. 26) so that a single terminal 18 can be crimped simultaneously to both wire segments in a "doubling" process when they arrive at the appropriate terminal attachment press 43, 44, 46, 47. The minumum length of the segment 12 doubled with the next coming segment is 400 mm. Two wire doubler modules 40 and 42, located at each side of the conveyor 34 as shown, enable production of endless chains of doubled wires. As FIGS. 24 through 28 make clear, each wire doubler module 42 comprises a rigid supporting framework 200 enabling it to be rigidly mounted on a conveyor table 33 by bolts 201 at an appropriate station adjacent conveyor unit 35, for example. Framework 200 supports a pair of vertically disposed spaced-apart stationary guide posts or rails 202. A lower doubler jaw assembly 204 is stationarly mounted on framework 200. An upper doubler jaw assembly 206 is slidably mounted for vertical movement between raised and lowered positions on the vertical guide posts 202, upper jaw assembly 206 being vertically movable by means of a pneumatic cylinder 208. The doubler jaw assemblies 204 and 206 include a pair of jaws 210 and 212, respectively, which are movable between open position (see FIG. 27) and closed position (see FIG. 28, for example) by pneumatic actuators 214 and 216, respectively, which are under the control of the controller 56.

Figure 24:
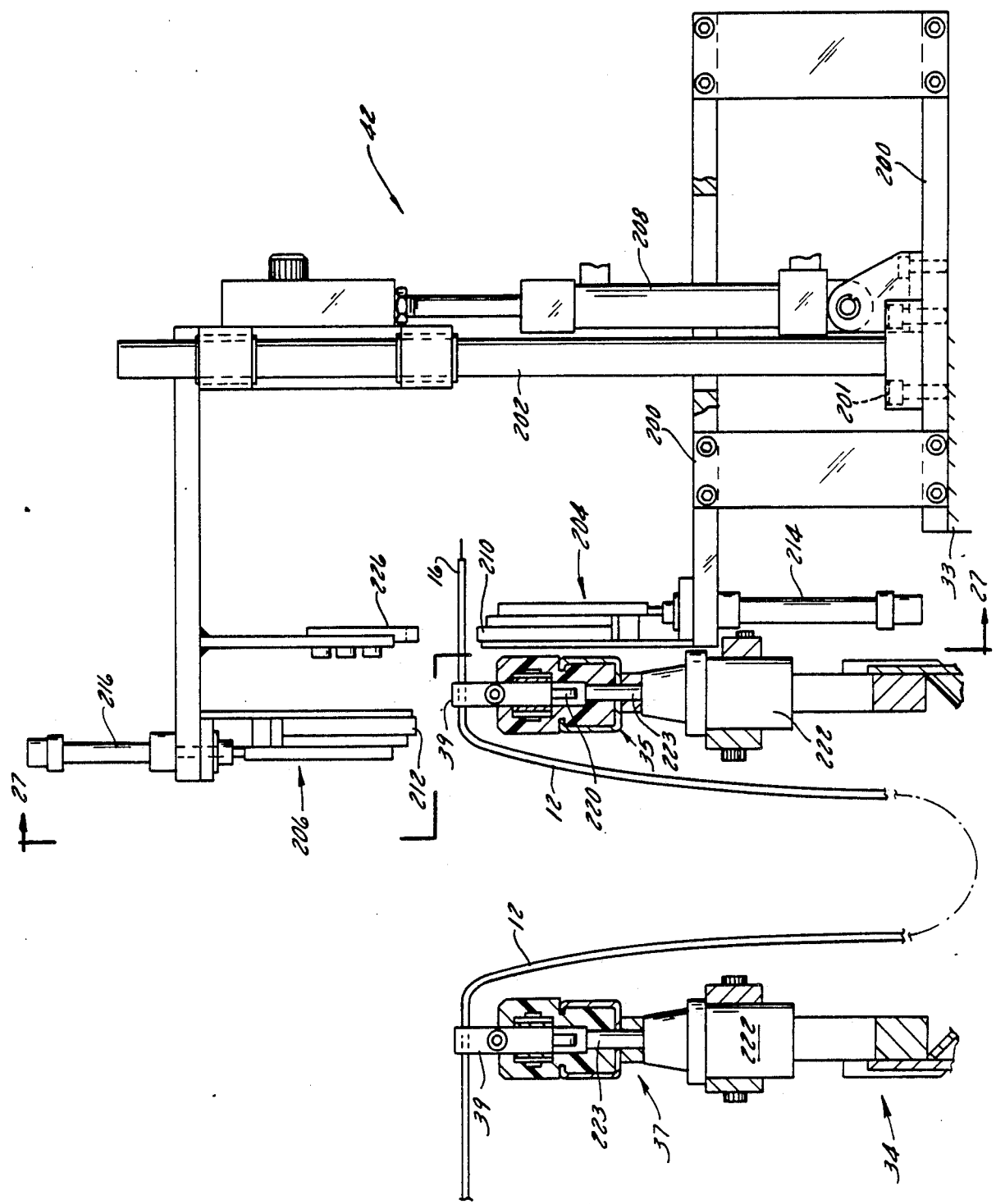
FIG. 24 is an enlarged view, partly in cross-section, of a wire doubler module shown in FIG. 3 and showing it in one operative position.
Figure 25:
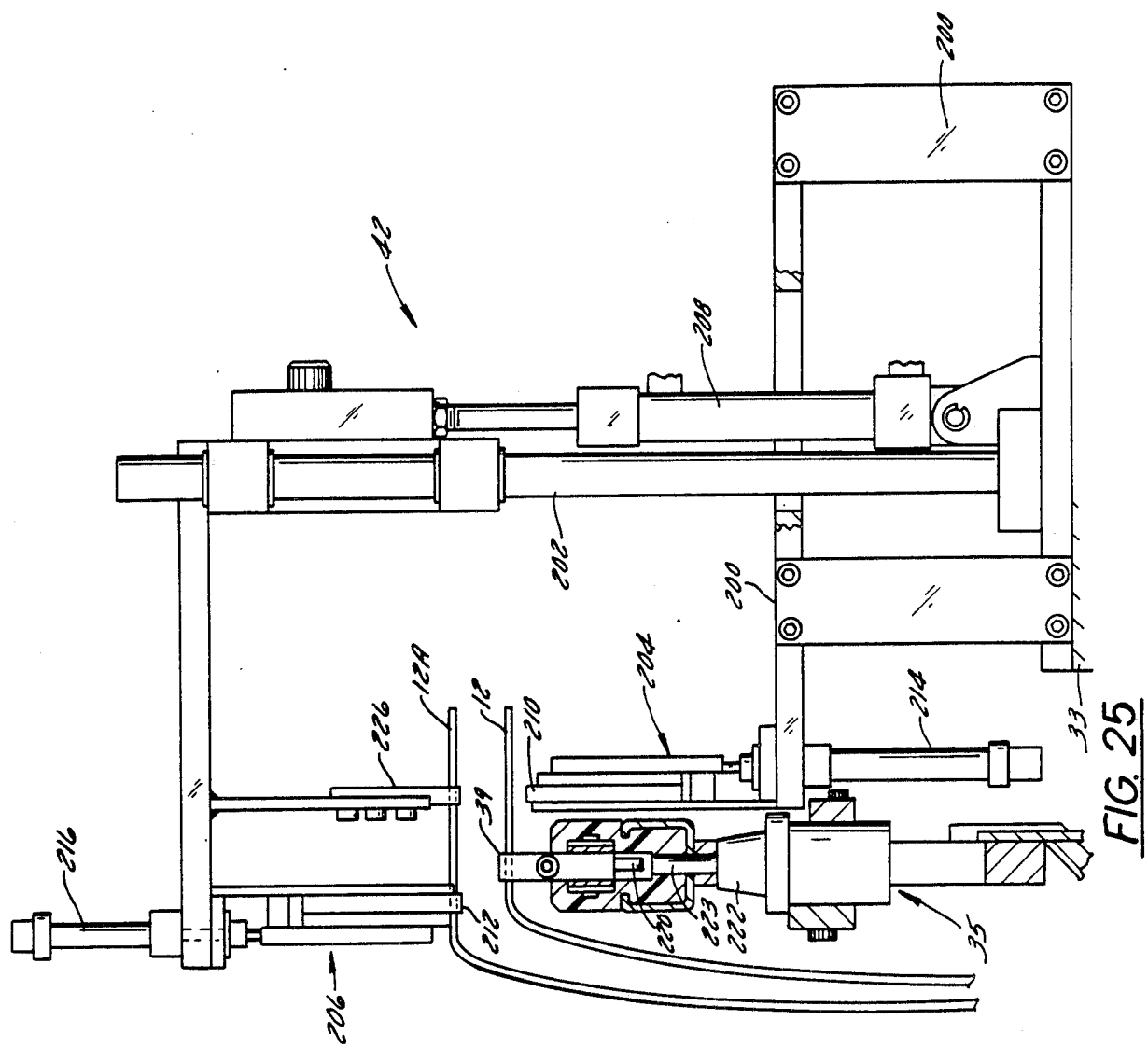
FIG. 25 is a view similar to FIG. 24 but showing the wire doubler machine in another operative position.
Figure 26:
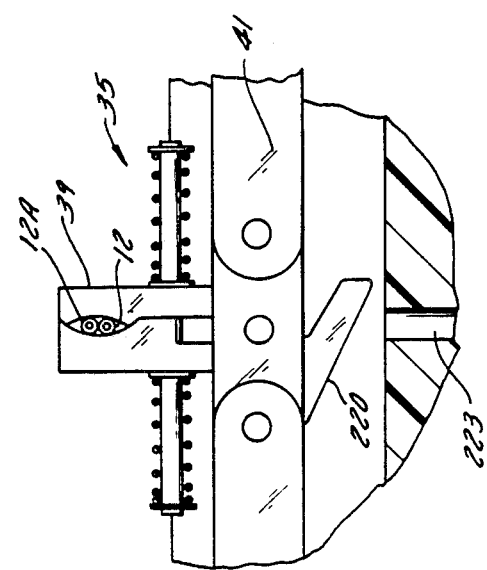
FIG. 26 is an enlarged side elevation view of a clamp shown in FIG. 25 but showing two wires "doubled" therein.
Figure 27:
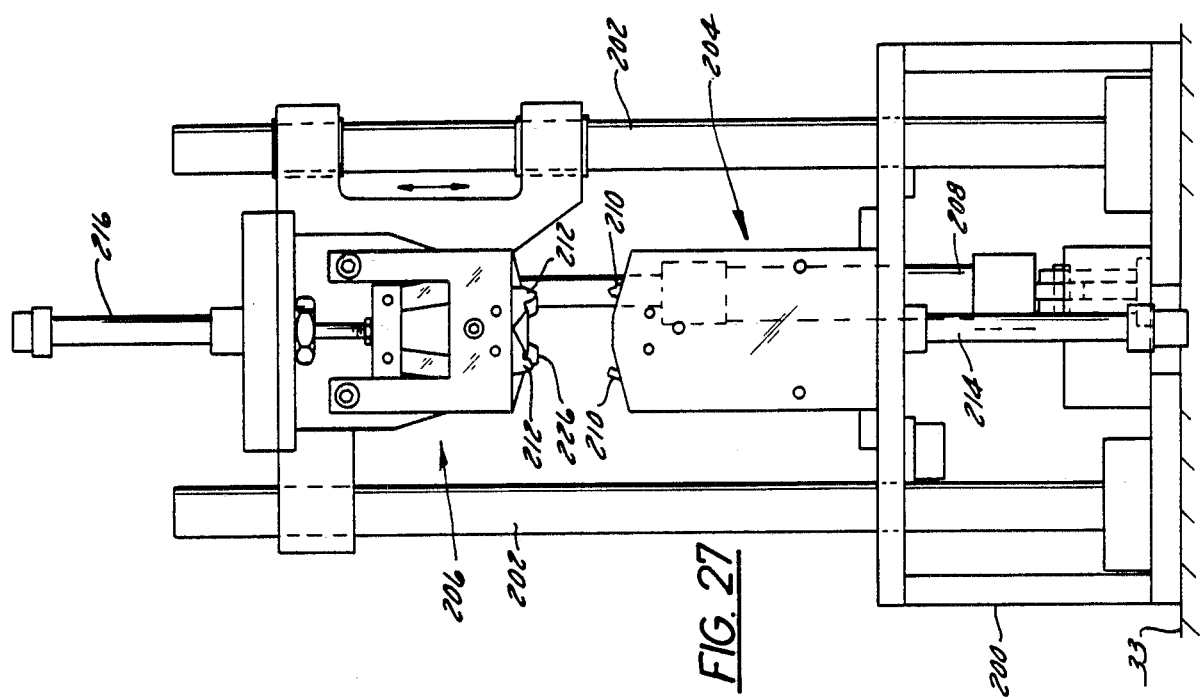
FIG. 27 is a view taken on line 27—27 of FIG. 24.
Figure 28:
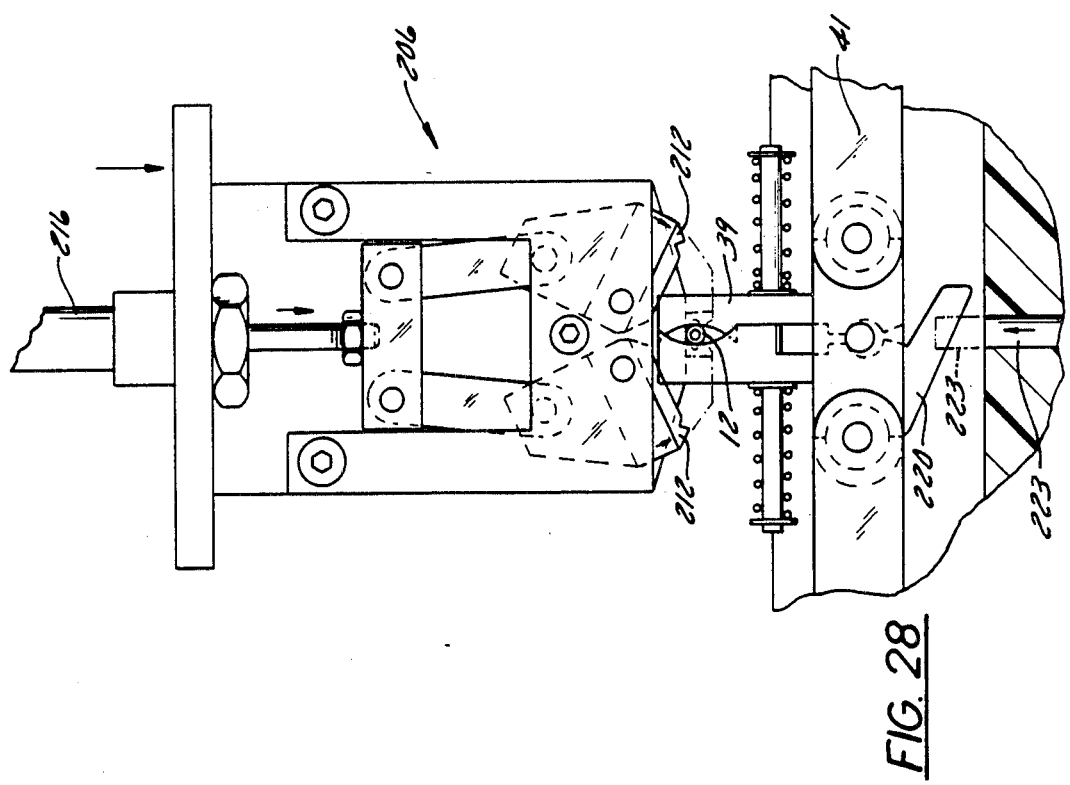
FIG. 28 is an enlarged side elevation view of the uppermost clamp shown in FIG. 27.

In a typical sequence of operation, a conveyor jaw 39 in closed position and with an end 16 of a wire segment 12 gripped therein moves to a position adjacent doubler module 42 (see FIG. 24). Upper doubler jaw assembly 206 descends and its jaw 212 closes to grip wire segment 12 (see FIG. 28). Conveyor jaw 39 opens to release its grip on segment 12, such being accomplished by tripping jaw 39 by its trip lever 220 being upwardly shifted by the rod 223 of a pneumatic actuator 222 shown in FIGS. 24, 25 and 28. Upper doubler jaw assembly 206 then ascends with its jaws closed to the position shown in FIG. 25 wherein it holds the wire segment (designated 12A in FIG. 25) in a raised position against a stop member 226. The conveyor jaw 39 from which segment 12A was removed closed and the conveyor 34 indexes to move the next wire segment 12 into position as shown in FIG. 25. The lower doubler jaw assembly 204 ascends from its lower position (FIG. 25) to its raised position with its jaws 210 open, and when it engages segment 12, its jaws 210 close to grip the segment. The conveyor jaw 39 opens while segment 12 is still therein. The upper doubler jaw assembly 206 with segment 12A gripped in its closed jaws 212 descends and emplaces wire segment 12A on top of wire segment 12 in conveyor jaw 39 whereupon jaw 39 closes to grip both wires (see FIG. 26). The upper doubler jaws 212 open and upper jaw assembly 206 ascends to its raised position. The lower doubler jaws 210 open and lower jaw assembly 204 descends to its lowered position. The conveyor unit 35 indexes and moves the doubled wire segments 12 and 12A to a terminal attachment module, if the program so requires.

Terminal Attachment Modules

As FIGS. 1, 2 and 3 show, the conveyor 34 moves each wire segment 12 in incremental steps along (and transverse to) path P2 and to one or more terminal attachment presses of a known conventional type, such as presses 43, 44, 46, 47, each of which is operable to crimp a terminal 18 of desired type to a stripped end 16 of a wire segment 12. Up to 8 or 9 presses, for example, can be mounted on each side of conveyor 34 to thereby process a wide selection of terminals. Both light duty and heavy duty presses can be used as terminal applicators. One terminal press with die unit is required for each type of terminal and for each wire size included in one production program. Terminals can be fed end-to-end or side-by-side.

Wire Marker

One or two wire marker modules 48 of conventional known type may be employed, with either programmable digits or colors to mark wire segments for identification.

Block Loader

As FIGS. 3 and 29 through 33 show, the block loader modules 52 and 54 are located downstream of the last terminal attachment presses, the wire markers, the pullback units, the continuity test modules, and near the discharge end of the conveyor 34. Each module 52, 54 received one end 16 of a selected terminated segment 12 from its clamp 39 and inserts the end into wire-receiving cavity 24 in block 22 in a predetermined order. Each terminal block attachment module 52, 54 is located near the discharge end of the conveyor 34 and is operable, if required, to present an insulating apertured terminal block 22 and to insert the ends 16 of selected segments 12 (single or doubled) and, with or without an electrical terminal 18 attached in the case of single segments, into selected cavities or apertures 24 in the terminal block 22 to thereby provide a wire harness. The block apertures 24 may be arranged in rows in a single layer, as shown in FIG. 11, or in a plurality of such layers (not shown), one above the other, with up to four layers, for example. The block loader 52, 54 is separate from the conveyor and receives the terminated segment 12 from the conveyor claim 39 and inserts it in a programmable sequence into a cavity 24 of block 22. Typically, only terminals 18 with inserting motion having the same axis as the segment axis can be inserted, and only blocks 22 that can be reliably fed by vibrating devices or from magazine or strip form are normally used. Typically, the minumum distance between cavities measured on horizontal or vertical axis is 5 mm, and the number of cavities is a maximum of 16 per level (horizontal axis) and a maximum of 4 levels (vertical axis). Insertion can be made at random in each level with possible crossing between block loaders 52 and 54, or insertion can be in one level at a time from the lower lever to the upper level. Two identical blocks 22 can be loaded at the same time on each block loader 52, 54. At each insertion a pull test is performed to check correct locking of the terminal 18 (or wire end 16) in its cavity 24 and an electrical continuity test is also performed.

As FIGS. 29 through 33 show, block loaders 52 and 54 are identical to each other, except for being mirror images of each other. Therefore, a description of one will suffice for both. It should be understood, however, that in the embodiment shown, if a wire segment 12 is tautly held by clamps 39 on the conveyor units 35 and 37, and if the block loaders 52 and 54 receive such a taut end from a conveyor clamp 39, they will be unable to shift the segment end outwardly from the outer side of a conveyor unit 35 or 37 to effect insertion of the segment end into a block 22. Accordingly, it is then necessary to provide a pull-back module 50, 51, such as shown in FIGS. 22 and 23, to bring the ends of the segment toward each other sufficiently far as to introduce slack in that portion of the wire segment 12 between the conveyor units 35 and 37. Such a pull-back module is also usable at any other location along conveyor 34 where slack must be introduced in a taut wire segment 12 to enable manipulation of its end axially in opposite directions to facilitate processing of that end.

As FIGS. 22 and 23 show, pull-back module 51, for example, comprises a stationary framework 300 rigidly secured to a conveyor table 33 as by bolts such as 302. Framework 300 rigidly supports four bearings or bushings 304 in which a pair of support shafts 306 are slidably mounted for axial movement in opposite directions. One end of each of the shafts 306 is rigidly secured to a pull-back clamp assembly 308. A pneumatic clyinder 310 is operatively connected between clamp assembly 308 and framework 300 and operates in response to controller 56 to shift clamp assembly 308 between the positions shown in solid and in phantom lines in FIG. 22. Clamp assembly 308 comprises a pair of jaws 312 which are movable between closed and open positions (shown in solid and phantom lines, respectively, in FIG. 23) by means of a pneumatically operated mechanism (not shown) which is understood to be internally mounted within the housing 314 of clamp assembly 308. In operation, while the end of a wire segment 12 is gripped in a conveyor clamp 39, the jaws 312 also close and grip the segment end. Then, the conveyor clamp 39 opens to release its grip on the wire segment and the pneumatic cylinder 310 operates to shift clamp assembly 308 from its retracted to its extended position, as shown in FIG. 22, thereby introducing slack in wire segment 12. Thereafter, conveyor claim 39 recloses to regrip the wire segment 12 (which has moved distance D in FIG. 22), the jaws 312 open and release their grip, the conveyor 34 index to move the wire segment to the next position, and the clamp assembly 308 retracts.

Turning again to FIGS. 29 through 33, assume that a wire segment 12 with sufficient slack therein between the conveyor units 35 and 37 is presented by a conveyor clamp 39 to block loader 52. As FIG. 31 shows, conveyor clamp 39 is shifted from closed to open position by means of a reciprocably movable actuator 301 which acts on trip lever 220 of clamp 39. Actuator 301 is moved by a cam 302 which is mounted on and rotates with a shaft 305 which conveyor sprocket 307 is mounted. As hereinbefore mentioned, a block 22 is delivered and held stationary in the position shown in FIGS. 30 through 33 by conventional means (not shown) and the end 16 of a wire segment 12 (with or without a terminator 18 thereon) is gripped by a pair of movable block loader jaws 308 and, after release of conveyor jaw 39, is moved into the appropriate cavity 24, as determined by controller 56. The block loader jaws 308 are mounted for swinging or pivotal movement between open and closed positions on a block loader jaw assembly 312 and are operated by a pneumatic cylinder 313 in response to controller 56.

The block loader assembly 312 is movable along three axes (X, Y and Z) relative to block 22. The assembly 312 is movable horizontally away from the end of conveyor 34 along axis X; horizontally transversely to the conveyor 34 along axis Y; and vertically relative to the conveyor 34 along axis Z. Movement along the axes X, Y and Z is controlled or effected by the pneumatic cylinders 316, 318 and 320, respectively.

Figure 29:
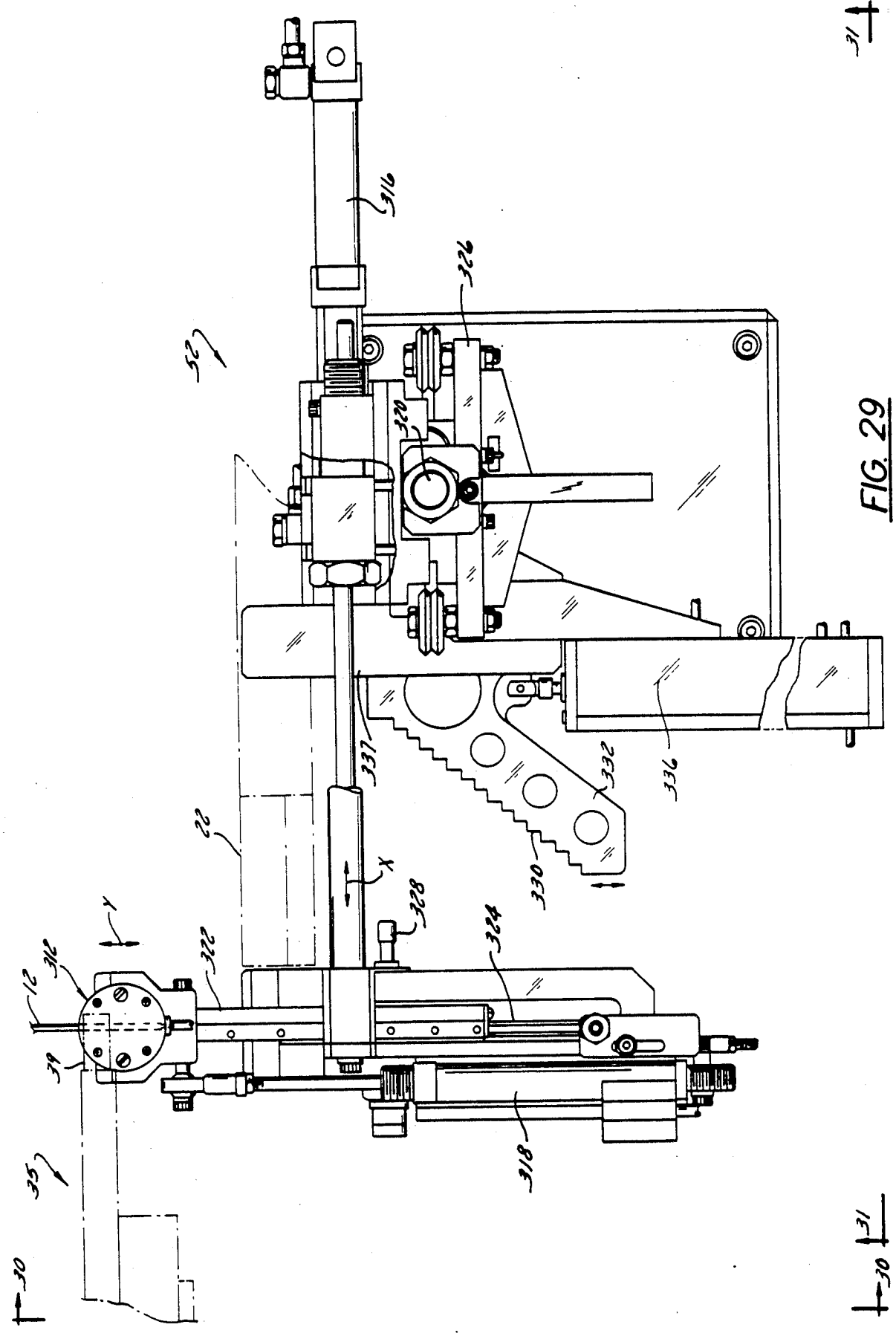
FIG. 29 is a top plan view, greatly enlarged, of one of the terminal block attachment modules shown in FIG. 3.

The block loader assembly 312 is, as FIG. 29 shows, mounted on the end of a guide 322 which is slidably mounted on a member 324 for movement on the Y axis by cylinder 318; and the assembly 312, in turn, is slidably mounted on carriage 326 for movement on the X axis by cylinder 316. Member 324 carries a stop member 328 which is engageable with any one of 16 steps or notches 330 in a cam plate 332 and is mounted for slidable movement along the Y axis on a member 337 by means of a pneumatic cylinder 336. Preferably, cylinder 336 is similar in construction to cylinder 108 hereinbefore described in connection with FIGS. 13, 14 and 15 and is able to position cam plate 332 at any one of 16 positions along the Y axis. Thus, stop member 328 is moved into engagement with the appropriate one of the 16 notches 330 to ensure proper alignment of the axis of the end 16 of a wire segment 12 with the cavity 24 in block 22 into which it is to be inserted. Cylinder 336 is under the control of electronic controller 56, as are the other cylinders 316, 318 and 320. The assembly 312 is slidably mounted for movement on the Z axis by cylinder 320.

Figure 30:
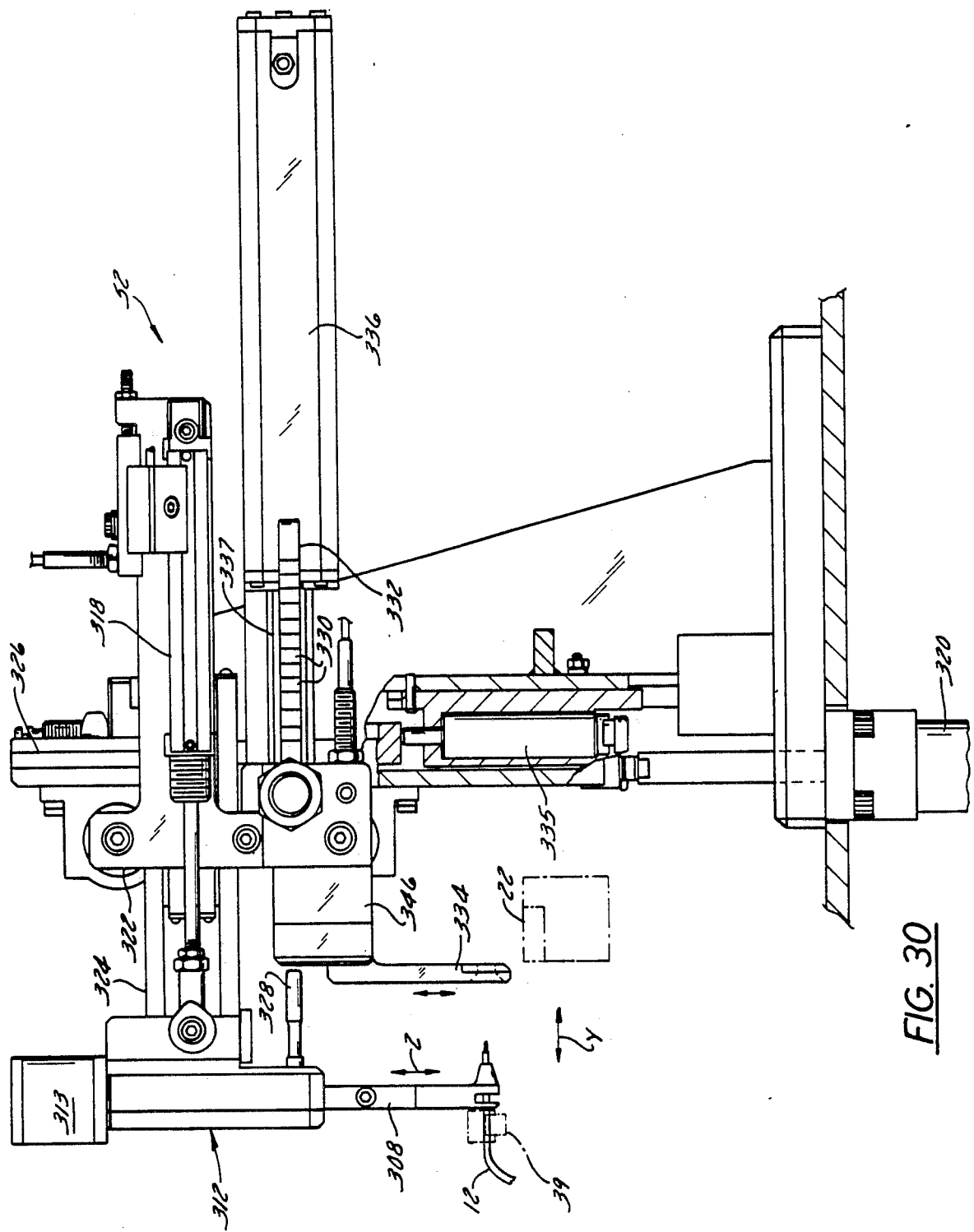
FIG. 30 is an end view, partly in section, taken on line 30—30 of FIG. 29.
Figure 31:
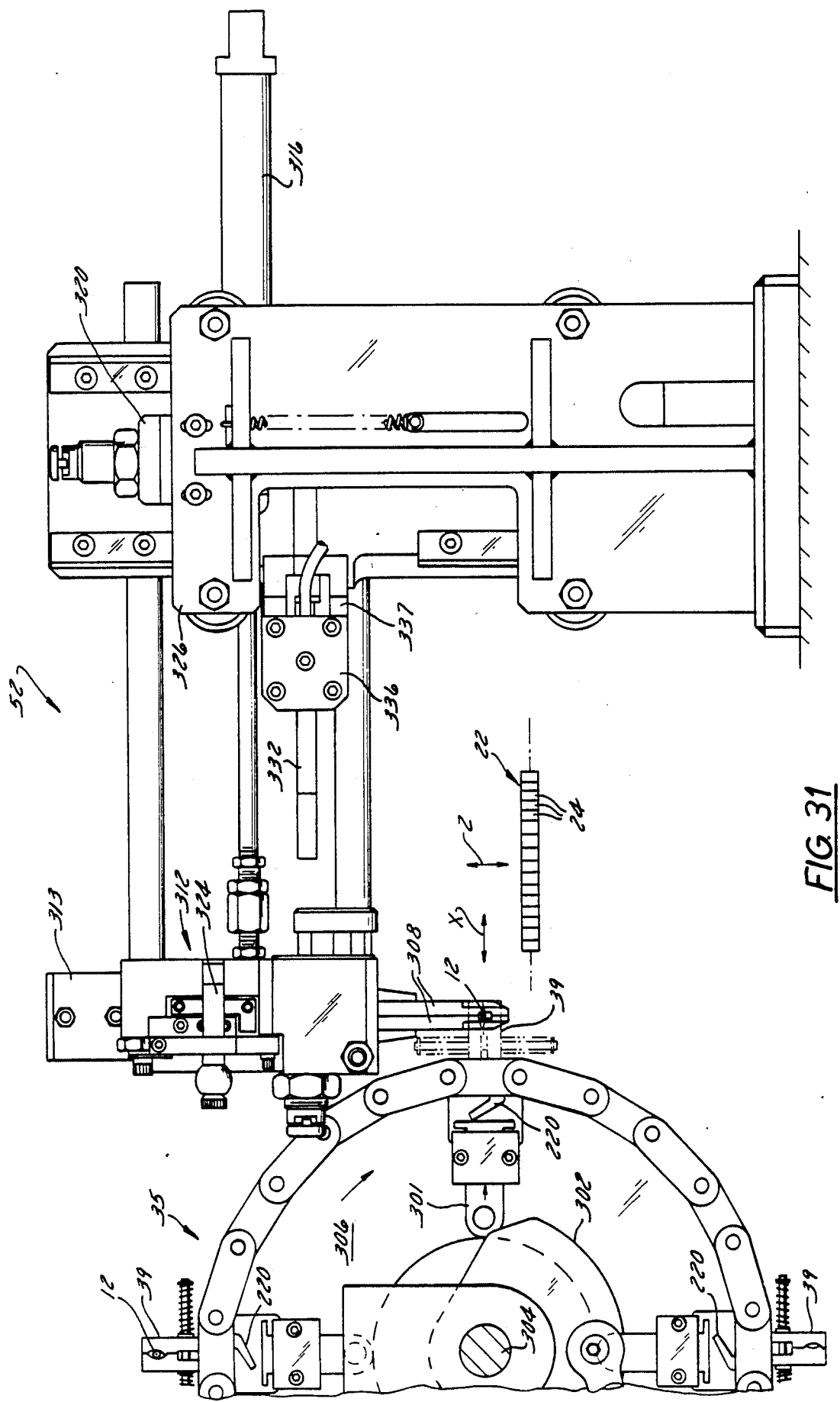
FIG. 31 is a side elevation view taken on line 31—31 of FIG. 29.
Figure 32:
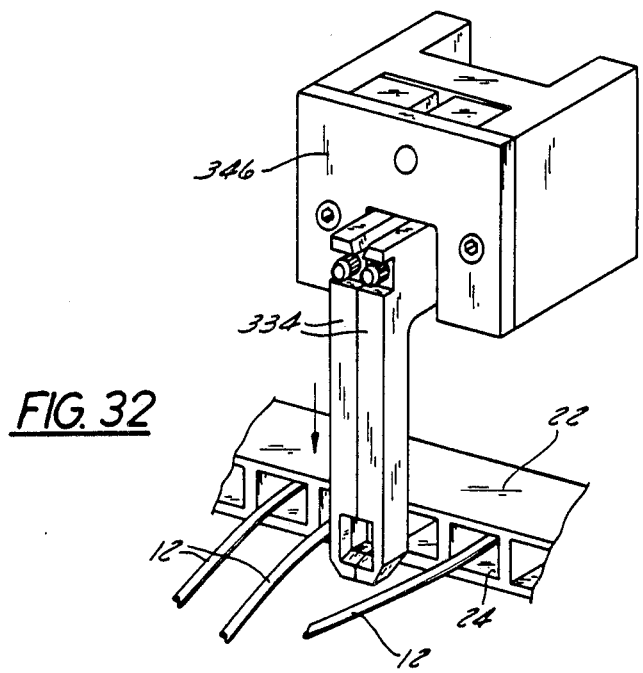
FIG. 32 is a perspective view of a portion of the block attachment module during one stage of operation.
Figure 33:
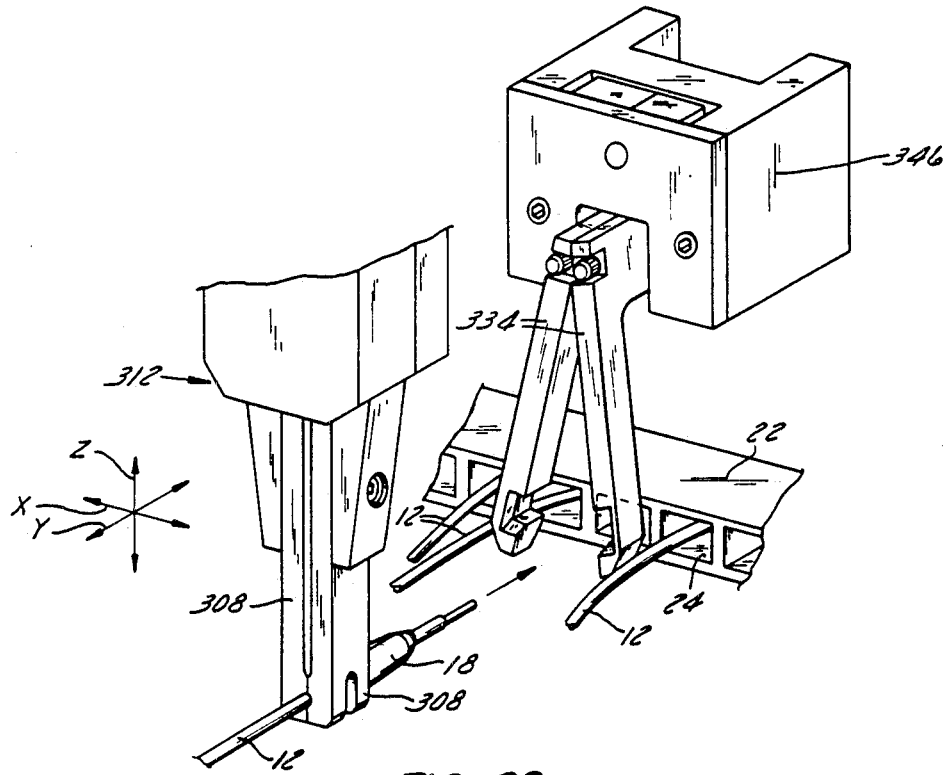
FIG. 33 is a view similar to FIG. 32 but showing the portion during a subsequent stage of operation.

As FIGS. 30, 32 and 33 make clear, wire segments 12 already affixed to a block 22 tend to droop downwardly in irregular fashion and can interfere with proper insertion of another segment 12. Accordingly, block loader 52 is provided with a pair of spreader jaws 334 pivotally mounted on a spreader jaw assembly 346 and operable between open (FIG. 33) and closed (FIG. 32) positions by a pneumatic motor 335 in assembly 346. The spreader jaws 334 are aligned with the block loader jaws 308 and move in unison therewith so as to align with a selected cavity 24 while closed (see FIG. 32) and then open (see FIG. 33) to spread apart adjacent wire segments 12 to allow clear access for another wire segment 12 being inserted by the block loader jaws 308.

Electronic Controller

The programmable controller 56, which includes the control cabinet 56A, operates the various aforedescribed modules and conveyor 34 in coordination and synchronism according to selected programs to provide various desired wire segments 12 in various desired sequences to provide harnesses of desired sizes and configurations. The control 56 controls conveyor indexing and coordinates it with the function of the modules. The production program can be entered by a key board as on control cabinet 56A or by a pre-programmed tape cassette (not shown) which includes, as an example, the program for one complete harness or any other defined group of wires. The control 56 includes all circuits and components necessary for operation and control of the apparatus 10. The control cabinet 56A is divided into two separate areas, one for power components and one for the electronic circuits. The area for power components is understood to comprise, for example, the following components (not shown): a 380 V/110 V transformer unit; a 24 V DC power supply; and relays, contactors, fuses and terminal connectors. The area for the electronic circuits comprises, for example, the following components (not shown): processor unit, input modules, output modules, data cassette unit, operator panel, and motor drive.

The apparatus 10 is supplied with 380 VAC 3-phase, 50 Hz (or 220 VAC, 50 Hz if required) electric power. The transformer unit (not shown) transforms the voltage level to 110 VAC which is used for contactors, solenoids, etc. Power such as 380 VAC (or 220 VAC) is used for various motors.

The 24 V DC stabilized, electronic short-circuit protected, power supply is used for all input signals to the control unit such as proximity sensors and limit switches.

The number of contactors, relays, terminal connectors will vary according to the arrangement of the apparatus 10.

All functions of the apparatus 10 are controlled by the processor unit (not shown) in the controller 56 such as a Struthers Dunn 4001 PLC with a 4 k capacity. To monitor the apparatus status, the processor unit receives all information through input modules. The input signals may vary from 12 V to 200 V, AC or DC. The process of the apparatus 10 is controlled by output modules (not shown). The output signals may be rated up to 125 VDC (NPN), 48 VDC (PNP) or 240 VAC. Data input and output modules (not shown) are also available for data handling. The user program is loaded into the processor unit (not shown) in cabinet 56 by means of a data cassette unit (not shown).

As FIGS. 2 and 3 show, all functions such as cycle start and stop, momentary cycle interruption, step-by-step operation are executed from the operator panel 57 located on the door of the control cabinet 56A. In addition, the wire length parameter can be set, as well as the bath quantity. The operator panel 57 also monitors information such as: emergency stop, open protective guards, air pressure failure, batch completed, motor protections, wire and terminal run-outs. All operator control functions are secured by a panel access keyswitch (not shown). The motor drive is selected according to the type of motor used in the wireloader.

Operator panel 57 may have, for example, the following designated switches and controls to carry out the stated functions, namely: start/stop machine, preset number of harnesses to be processed, adjust wire length, adjust stripping length, single step running (jogging).

Operator panel 57 may have, for example, the following designated displays, namely: air pressure status, emergency stop, run-out of wire or terminals, motor protection defective, machine stop when number of preset harnesses reached, enter fault indication.

Many other modules not herein shown can be installed to achieve various processes at the end of the wire such as fluxing and tinning and boot insertion. Other modules can be added to fulfill user requirements.

We claim:

1. Apparatus (10) for providing and conveying wire segments (12) cut from strands (W) of wire or cable comprising:

loader means (32) for propelling a strand (W) along a path (P1);

selector means (30) for presenting the free ends of a plurality of strands (W) in a predetermined sequence to said loader means (32) for propulsion along said path (P1);

severing means (180) for severing each strand (W) downstream of said loader means after a portion thereof has been propelled along said path (P1) to provide a segment (12);

conveyor means (34) having releasable clamp means (39) for receiving a strand (W) being propelled along said path (P1) and for conveying a segment (12) cut therefrom, said clamp means comprising a pair of spaced apart clamps (39, 39) for gripping a segment (12) near the opposite ends thereof;

and doubler means (40, 42) for releasing an end (16) of one segment (12) from the clamp (39) in which it was initially received and for inserting said end (16) into an on-coming clamp (39) containing an end (16) of another segment (12).

2. Apparatus (10) according to claim 1 including an elongated wire guide (58B) located along said path (P1) between a pair of spaced apart clamps (39) aligned with said path, said wire guide having a wire-receiving passage (59) therethrough and means (61, 62) to open said passage (59) along a side thereof to enable a strand (W) to form a downwardly depending loop of desired length between said clamps (39, 39) and also to enable a segment (12) cut from the strand W to be conveyed laterally away from said wire guide (58B) by said clamps (39, 39).

3. Apparatus (10) according to claim 2 including switch means (60, 61A) actuatable by a strand (W) moving along said path (P1) to effect operation of said means (61, 62) to open said passage (59) only after the strand (W) is disposed between both spaced apart clamps (39, 39).

4. Apparatus (10) according to claim 2 or 3 including a wire-engaging means (63) in said passage (59) operable to prevent reverse movement of a wire strand (W) in said passage (59) prior to closure of said pair of clamps (39, 39).

5. Apparatus (10) according to claim 2 or 3 including block loader means (52) for providing a terminal block (22) having at least one aperture (24) therein and for inserting an end of at least one segment into said aperture.

6. Wire processing apparatus (10) comprising:

conveyor means (34) including releasable clamps (39) for receiving and moving wire segments (12) along a path (P2);

means (32) for inserting wire segments (12) into said clamps (39);

wire processing means (43) located adjacent said path (P2) for performing an operation on a wire segment (12) conveyed thereto by a clamp (39); and means (40, 42) for releasing a predetermined wire segment (12) from one clamp (39) and inserting said predetermined wire segment (12) into another clamp (39) prior to arrival of said other clamp (39) at said wire processing means (43).

7. Wire processing apparatus (10) according to claim 6 wherein said conveyor means (34) comprises a pair of clamps (39) for receiving and moving each wire segment; and wherein said means (40, 42) for releasing said predetermined wire segment (12) operates to release said predetermined wire segment (12) from at least one clamp (39) of a respective pair of clamps (39, 39) and to insert said wire segment (12) into at least one clamp (39) of another pair of said clamps (39, 39).

8. Wire processing apparatus (10) according to claim 7 including means (56, 152, 58) for predetermining the length of that portion of a wire segment (12) disposed between a pair of clamps (39, 39) which receive and move the respective wire segment (12).

9. Wire processing apparatus (10) according to claim 6 or 20 or 21 wherein said wire processing means comprises terminal attachment means (43, 44, 46, 47).

10. Wire processing apparatus (10) comprising:

conveyor means (34) including releasable clamps (39) for receiving and moving wire segments (12) along a path (P2), said conveyor means (34) comprising a pair of said clamps (39) for receiving and moving each wire segment (12);

means (32) for inserting wire segments (12) into said clamps (39);

terminal attachment means (43, 46) located adjacent said path (P2) for affixing a terminal (18) to an end (16) of a wire segment (12) conveyed thereto by a pair of said clamps (39); and means (40, 42) for releasing one end (16) of a predetermined wire segment (12) from one clamp (39) of a respective pair of clamps (39) and for inserting said one end (16) into one clamp (39) of another pair of said clamps (39) prior to arrival of said other pair of clamps (39) at said terminal attachment means (43).

11. Wire processing apparatus (10) according to claim 10 including means (56, 152, 58) for predetermining the length of that portion of a wire segment (12) disposed between a pair of clamps (39, 39) which receive and move the respective wire segment (12).

12. Apparatus (10) for inserting an end (16) of a wire segment (12) into a cavity (24) in a terminal block (22) comprising:

conveyor means (34) having releasable clamp means (39) for conveying a wire segment (12) along a path (P2) with the segment axis transverse to said path (P2);

means for providing a terminal block (22) and for maintaining its stationary relative to said conveyor means;

and a block loader means (52) having releasable clamp means (308) for receiving said wire segment (12) from said conveyor means (34), said block loader means further comprising drive means (316, 318, 320) for shifting said releasable clamp means (308) along three axes (X, Y, Z) relative to a cavity (24) in said terminal block (22), said block loader means (52) further comprising a stop member (328) on said clamp means (308) and an adjustably positionable cam (332) having a plurality of cam surfaces (330) engageable with said stop member (328) to position said clamp means (308) relative to said cavity (24) in said terminal block (22).

13. Apparatus according to claim 12 wherein said block loader means (52) further comprises a multi-cylinder pneumatic drive means to position said cam (332).

14. Apparatus for processing wire comprising:

conveyor means for conveying a plurality of wire segments along a path in side-by-side spaced apart relationship, said conveyor means comprising a pair of conveyor units laterally spaced apart from each other in a direction transverse to said path, each conveyor unit having wire gripping means to releasably grip each wire segment near an end thereof;

and means associated with at least one of said conveyor units to cause a wire gripping means to release its grip from one end of a wire segment and to position said one end adjacent another wire segment end associated with said one conveyor unit so as to enable both ends to be attached to a common terminal;

and terminal attachment means associated with said one conveyor unit and operable to attach said common terminal to said both ends.

* * * * *